(12) United States Patent
Liu et al.

(10) Patent No.: US 8,369,139 B2
(45) Date of Patent: *Feb. 5, 2013

(54) NON-VOLATILE MEMORY WITH RESISTIVE ACCESS COMPONENT

(75) Inventors: Jun Liu, Boise, ID (US); Michael P. Violette, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/158,794

(22) Filed: Jun. 13, 2011

(65) Prior Publication Data

US 2011/0233504 A1 Sep. 29, 2011

Related U.S. Application Data

(63) Continuation of application No. 12/046,307, filed on Mar. 11, 2008, now Pat. No. 7,961,507.

(51) Int. Cl.
*G11C 11/00* (2006.01)

(52) U.S. Cl. ............ 365/163; 365/171; 365/173; 257/2; 257/3; 257/390

(58) Field of Classification Search .................. 365/148, 365/158, 171, 173, 163; 257/2, 296, 255
See application file for complete search history.

(56) References Cited

U.S. PATENT DOCUMENTS

| 5,359,205 A * | 10/1994 | Ovshinsky ................... 257/3 |
| 5,991,193 A | 11/1999 | Gallagher et al. |
| 6,855,975 B2 * | 2/2005 | Gilton ........................ 257/296 |
| 6,870,751 B2 | 3/2005 | Van Brocklin et al. |
| 6,940,085 B2 | 9/2005 | Fricke et al. |
| 7,056,762 B2 | 6/2006 | Moore et al. |
| 7,214,587 B2 | 5/2007 | Pinnow et al. |
| 7,557,372 B2 | 7/2009 | Yang et al. |
| 7,961,507 B2 | 6/2011 | Liu et al. |
| 2003/0155589 A1 * | 8/2003 | Campbell et al. ............. 257/225 |
| 2004/0042259 A1 | 3/2004 | Campbell et al. |
| 2006/0001045 A1 | 1/2006 | Sidhu et al. |

(Continued)

FOREIGN PATENT DOCUMENTS

| WO | WO-8701851 A1 | 3/1987 |
| WO | WO-8810811 | 3/1988 |

(Continued)

OTHER PUBLICATIONS

Oh, J. H., et al., "Full Integration of Highly Manufacturable 512Mb PRAM based on 90nm Technology", IEEE International Electron Devices Meeting, 2006. IEDM '06., (2006), 1-4.

*Primary Examiner* — Pho M Luu
*Assistant Examiner* — Thao Bui
(74) *Attorney, Agent, or Firm* — Schwegman, Lundberg & Woessner, P.A.

(57) ABSTRACT

Some embodiments include apparatus and methods having a memory element configured to store information and an access component configured to allow conduction of current through the memory element when a first voltage difference in a first direction across the memory element and the access component exceeds a first voltage value and to prevent conduction of current through the memory element when a second voltage difference in a second direction across the memory element and the access component exceeds a second voltage value, wherein the access component includes a material excluding silicon.

17 Claims, 19 Drawing Sheets

U.S. PATENT DOCUMENTS

| | | |
|---|---|---|
| 2006/0035403 A1 | 2/2006 | Campbell |
| 2006/0050546 A1 | 3/2006 | Roehr |
| 2006/0239058 A1 | 10/2006 | Daley |
| 2007/0045615 A1 | 3/2007 | Cho et al. |
| 2007/0070695 A1 | 3/2007 | Lim et al. |
| 2007/0077699 A1 | 4/2007 | Gordon et al. |
| 2007/0132049 A1 | 6/2007 | Stipe |
| 2007/0285967 A1 | 12/2007 | Toda et al. |
| 2007/0297231 A1 | 12/2007 | Gilton |
| 2008/0304307 A1* | 12/2008 | Gopalakrishnan ............. 365/51 |
| 2009/0231910 A1 | 9/2009 | Liu et al. |

FOREIGN PATENT DOCUMENTS

| | | |
|---|---|---|
| WO | WO-8903574 | 4/1989 |
| WO | WO-2006128896 | 12/2006 |
| WO | WO-2009114162 A1 | 9/2009 |

* cited by examiner

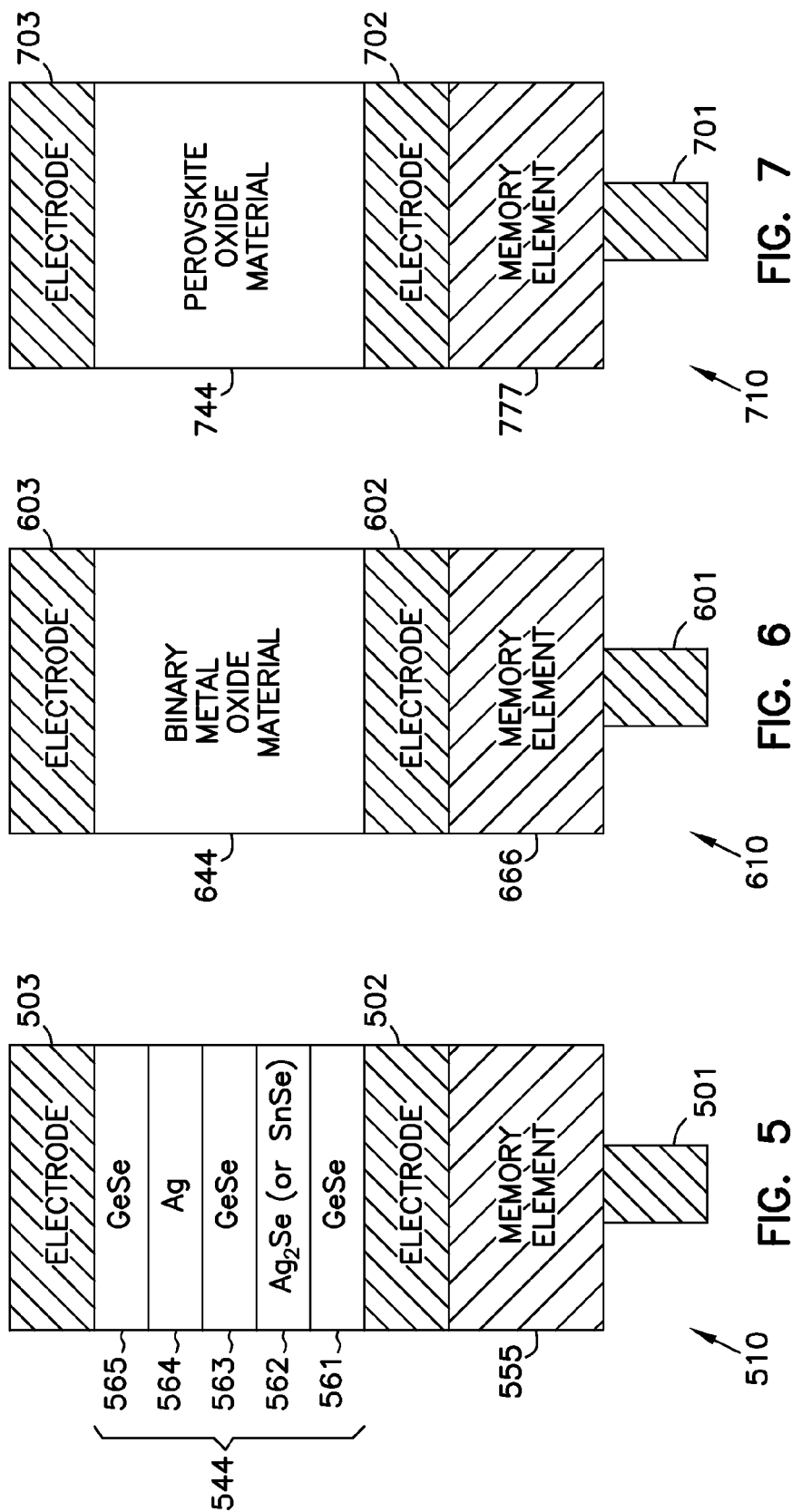

NON-VOLATILE MEMORY WITH RESISTIVE ACCESS COMPONENT

PRIORITY APPLICATION

This application is a continuation of U.S. application Ser. No. 12/046,307, filed Mar. 11, 2008, now issued as U.S. Pat. No. 7,961,507, which is incorporated herein by reference in its entirety.

BACKGROUND

Computers and other electronic products, e.g., digital televisions, digital cameras, and cellular phones, usually have a memory device with numerous memory cells to store data and other information. Some conventional memory devices may store information based on the amount of charges on a storage node of the memory cell. Different values of the charge on the storage node may represent different values (e.g., binary values "0" and "1") of the information stored in the memory cell. The storage node usually includes semiconductor material such as silicon.

Some other conventional memory devices, e.g., phase change memory devices, may store information based on a resistance state (instead of the amount of charge) of a memory element of the memory cell. The memory element may include a phase change material, which may be written (e.g., programmed) to change between different phases (e.g., crystalline and amorphous phases). Different phases of the material may cause the memory cell to have different resistance states to represent different values of the information stored in the memory cell.

The memory cell in these memory devices, e.g., phase change memory devices, often includes an access component to allow access to the memory element. In some cases, the material of the access component and the material of the memory element may have different process temperature tolerances. Therefore, producing some conventional memory devices may pose fabrication process challenges.

BRIEF DESCRIPTION OF THE DRAWINGS

FIG. 5 shows a cross-section of a memory cell including an access component having ionic-conducting chalcogenide material according to an embodiment of the invention.

FIG. 6 shows a cross-section of a memory cell including an access component having binary metal oxide material according to an embodiment of the invention.

FIG. 7 shows a cross-section of a memory cell including an access component having perovskite oxide material according to an embodiment of the invention.

DETAILED DESCRIPTION

Figure 1:
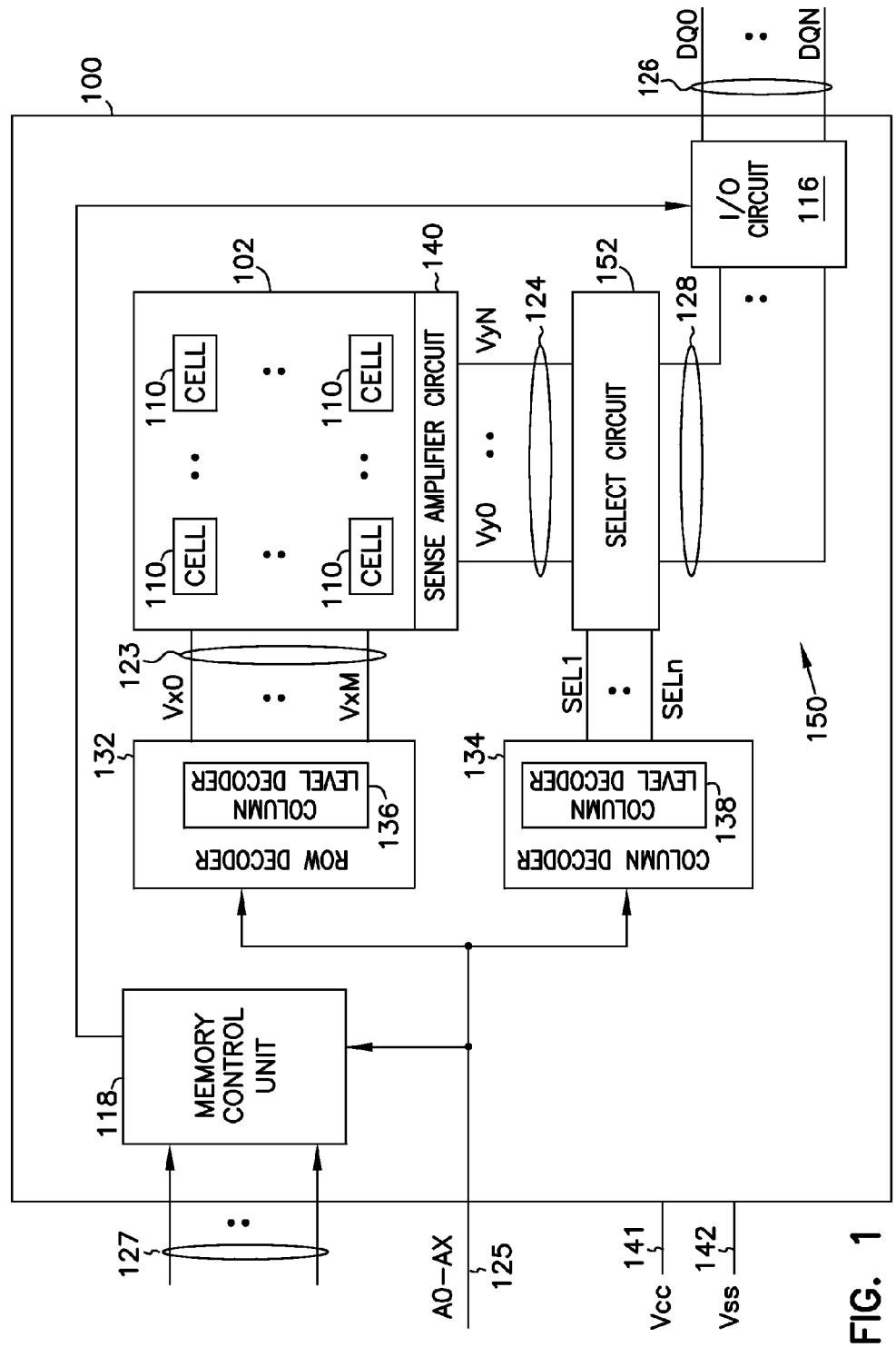
FIG. 1 shows a block diagram of a memory device having a memory array with memory cells according to an embodiment of the invention.

FIG. 1 shows a block diagram of a memory device 100 having a memory array 102 with memory cells 110 according to an embodiment of the invention. Memory cells 110 may be arranged in rows and columns along with lines 123 (e.g., wordlines having signals Vx0 through VxM) and lines 124 (e.g., bit lines having signals Vy0 through VyN). Memory device 100 may use lines 123 and lines 124 to transfer information within memory cells 110. Memory cells 110 may be physically located on multiple device levels such that one group of memory cells 110 may be stacked on one or more groups of other memory cells 110. Row decoder 132 and column decoder 134 may decode address signals A0 through AX on lines 125 (e.g., address lines) to determine which memory cells 110 are to be accessed. Row and column level decoders 136 and 138 of row and column decoders 132 and 134, respectively, may determine on which of the multiple device levels of device 100 that the memory cells 110 to be accessed are located.

A sense amplifier circuit 140 may operate to determine the value of information read from memory cells 110 and provide the information in the form of signals to lines 123 or lines 124. Sense amplifier circuit 140 may also use the signals on lines 123 or lines 124 to determine the value of information to be written to memory cells 110. Memory device 100 may include circuitry 150 to transfer information between memory array 102 and lines (e.g., data lines) 126. Signals DQ0 through DQN on lines 126 may represent information read from or written into memory cells 110. Lines 126 may include nodes within memory device 100 or pins (or solder balls) on a package where memory device 100 may reside. Other devices external to memory device 100 (e.g., a memory controller or a processor) may communicate with memory device 100 through lines 125, 126, and 127.

Memory device 100 may perform memory operations such as a read operation to read information from memory cells 110 and a write operation (sometime referred to as a programming operation) to write (e.g., program) information into memory cells 110. A memory control unit 118 may control the memory operations based on control signals on lines 127. Examples of the control signals on lines 127 may include one or more clock signals and other signals to indicate which operation, (e.g., a write or read operation) that memory device 100 may perform. Other devices external to memory device 100 (e.g., a processor or a memory controller) may control the values of the control signals on lines 127. Specific values of a combination of the signals on the lines may produce a command (e.g., a write or read command) that may cause memory device 100 to perform a corresponding memory operation (e.g., a write or read operation).

Each of memory cells 110 may be written to store information representing a value of a single bit (binary bit) or a value of multiple bits such as two, three, four, or other numbers of bits. For example, each of memory cells 110 may be written to store information representing a binary value "0" or "1" of a single bit. In another example, each of memory cells 110 may be written to store information representing a value of multiple bits, such as one of four possible values "00", "01", "10", and "11" of two bits, one of eight possible values "000", "001", "010", "011", "100", "101", "110" and "111, or one of other values of other number of multiple bits.

Memory device 100 may receive a supply voltage, including supply voltage signals Vcc and Vss, on lines 141 and 142, respectively. Supply voltage signal Vss may operate at a ground potential (e.g., having a value of approximately zero volts). Supply voltage signal Vcc may include an external voltage supplied to memory device 100 from an external power source such as a battery or an alternating-current to direct-current (AC-DC) converter circuitry.

Circuitry 150 of memory device 100 may include a select circuit 152 and an input/output (I/O) circuit 116. Select circuit 152 may respond to signals SEL0 through SELn to select the signals on lines 124 and 128 that may represent the information read from or written into memory cells 110. Column decoder 134 may selectively activate the SEL0 through SELn signals based on the A0 through AX address signals on lines 125. Select circuit 152 may select the signals on lines 124 and 128 to provide communication between memory array 102 and I/O circuit 116 during read and write operations.

Memory device 100 may include a non-volatile memory device and memory cells 110 may include non-volatile memory cells such that memory cells 110 may retain information stored thereon when power (e.g., Vcc or Vss, or both) is disconnected from memory device 100. For example, memory device 100 may include a phase change memory device such that each of memory cells 110 may include a memory element having a material in which at least a portion (e.g., programmable portion) of the material may be written to cause the portion to change between different phases, such as between a crystalline phase (or crystalline state) and an amorphous phase (or amorphous state). In each of memory cells 110, different phases of the material of the programmable portion may cause the memory cell to have a different resistance state to represent different value of the information stored therein.

Device 100 may selectively read or write memory cells 110. To write a selected memory cell 110, memory device 100 may apply a write current through the selected memory cell to cause the memory element of the selected memory cell to change to a resistance state based on the value of information to be stored therein. To read a selected memory cell 110, memory device 100 may apply a read current through the selected memory cell and then measure its resistance based on a read voltage to determine the corresponding value of information stored therein.

One skilled in the art may recognize that memory device 100 may include other features that are not shown in FIG. 1, to help focus on the embodiments described herein.

Memory device 100 may include at least one of the memory devices and memory cells described below with reference to FIG. 2 through FIG. 24.

Figure 2:
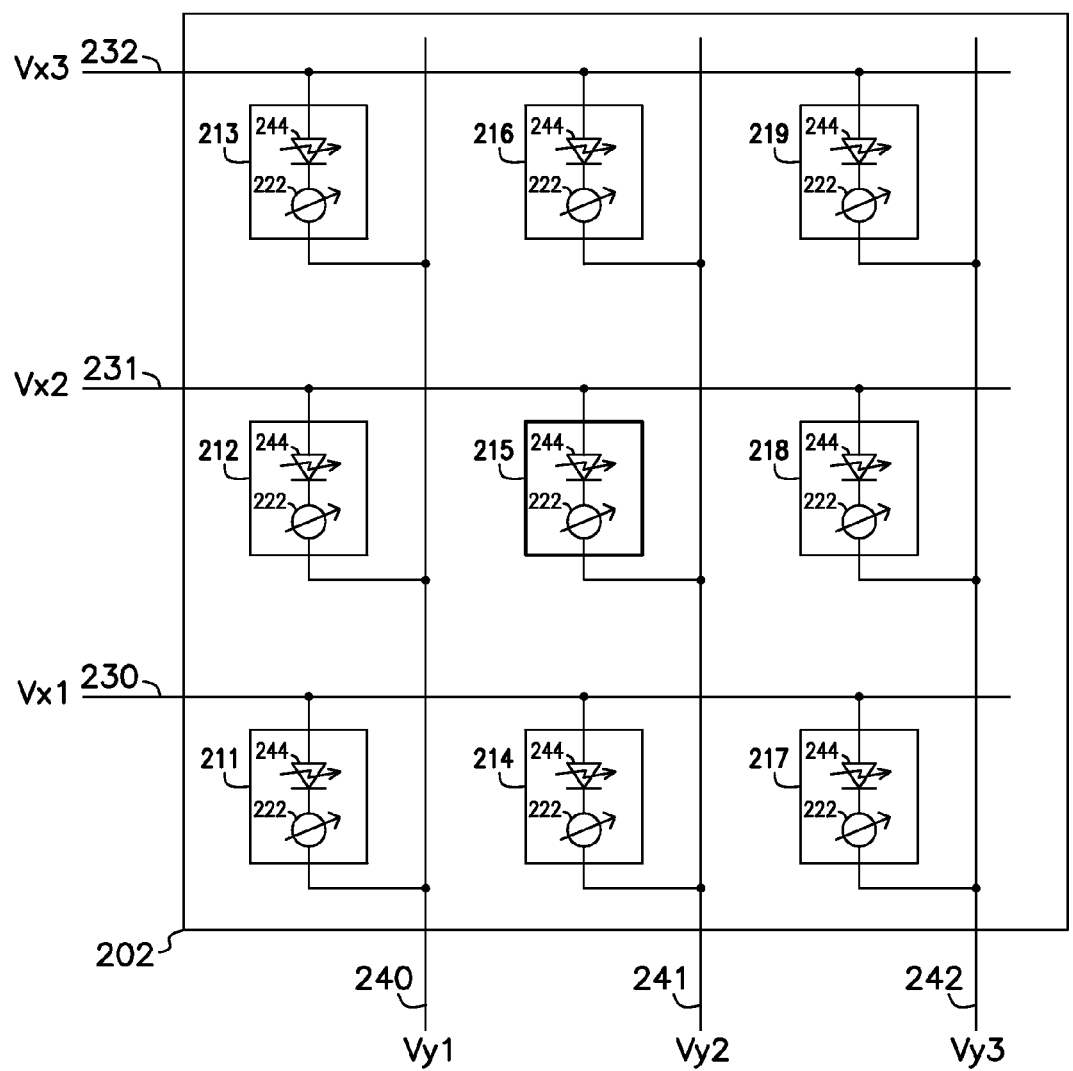
FIG. 2 shows a partial block diagram of a memory device having a memory array including phase change memory cells with access components and memory elements according to an embodiment of the invention.

FIG. 2 shows a partial block diagram of a memory device 200 having a memory array 202 including memory cells 211, 212, 213, 214, 215, 216, 217, 218, and 219 according to an embodiment of the invention. Memory array 202 may correspond to memory array 102 of FIG. 1. In FIG. 2, memory cells 211 through 219 may couple to lines 230, 231, and 232 having signals Vx1, Vx2, Vx3, respectively, and lines 240, 241, and 242 having signals Vy1, Vy2, and Vy3, respectively. Each of memory cells 211 through 219 may include a memory element 222 and an access component 244 coupled in series between one of lines 230, 231, and 232 and one of lines 240, 241, and 242. Each memory element 222 may include a material that may be written to various resistance states corresponding to various resistance values to represent different values of information stored therein. During a read or write operation, memory device 200 may use appropriate voltage values for signals Vx1, Vx2, Vx3, Vy1, Vy2, and Vy3 to turn on access component 244 of the memory cell that is being selected (selected memory cell) to be read or written to access (e.g., to read or write) the selected memory cell. Memory device 200 may turn off access component 244 of each of the memory cells that is not being selected (unselected memory cell).

For example, in a write operation, memory device 200 may select memory cell 215 to write information into it. In this example, memory device 200 may turn on access component 244 of memory cell 215 and then apply a write current through memory element 222 to cause its material to change from one resistance state to another resistance state. Thus, the resistance of a material of memory element 222 may also change from one resistance value to another resistance value representing the value of information to be stored in memory cell 215.

In another example, in a read operation, memory device 200 may select memory cell 215 to read information stored therein. In this example, memory device 200 may turn on access component 244 of memory cell 215 and then apply a read current through memory element 222 and measure its resistance (e.g., resistance of memory cell 215 between lines 231 and 241) based on a read voltage to determine the corresponding value of information stored therein. The read current may have a lower value than that of the write current so that the material of memory element 222 may remain at the same resistance state to keep the information stored therein at the same value after it is read. In both the write and read examples herein, memory device 200 may turn off access component 244 of each of the unselected memory cells (memory cells 210, 211, 212, 213, 216, 217, 218, and 219) so that memory element 222 of each of the unselected memory cells may remain unaccessed.

In the examples above, since memory cell 215 is assumed to be the selected memory cell, memory device 200 may use appropriate voltage values for signals Vx2 and Vy2 on lines 231 and 241 coupled to memory cell 215 so that a voltage difference (e.g., voltage drop) across memory cell 215 may have a sufficient value to turn on access component 244 of memory cell 215. When turned on, access component 244 of memory cell 215 may allow conduction of current (e.g., read or write current) through memory element 222 of memory cell 215 so that memory device 200 may read information from or write information into memory cell 215. For the unselected memory cells, memory device 200 may use appropriate voltage values for signals Vx1, Vx3, Vy1, and Vy3 to keep off (or turn off) access component 244 of each of the unselected memory cells to prevent conduction of current through the unselected memory cells.

Figure 3:
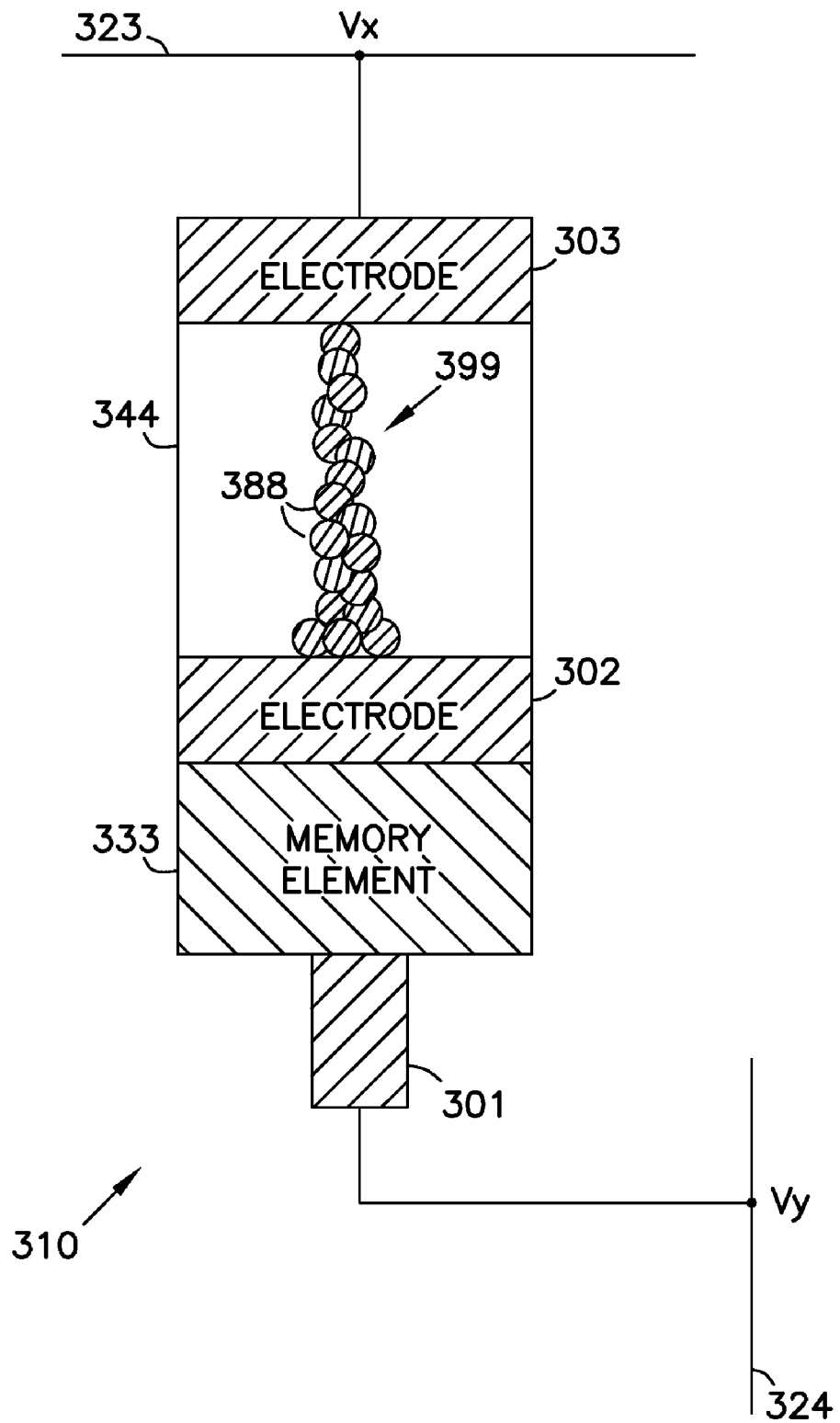
FIG. 3 shows a cross-section of a memory cell with an ionic conduction path according to an embodiment of the invention.

Memory cells 211 through 219 may include a memory cell similar to or identical to the memory cell of FIG. 3.

FIG. 3 shows a cross-section of a memory cell 310 with ionic conduction path 399 according to an embodiment of the invention. Memory cell 310 may include electrodes 301, 302, and 303, a memory element 333, and an access component 344. Signals Vx on line 323 of FIG. 3 may correspond to one of signals Vx1, Vx2, and Vx3 of FIG. 2. Signals Vy on line 324 of FIG. 3 may correspond to one of signals Vy1, Vy2, and Vy3 of FIG. 2.

For clarity, the drawings described herein may omit some cross-section lines of some features. For example, FIG. 3 omits cross-section lines of a part of access component 344.

In FIG. 3, the value of information stored in memory cell 310 may depend on the phase of the material of memory element 333. Memory element 333 may include a material (e.g., phase change material) with a melting point temperature Tm and a crystallization (or glass transition) temperature Tc. The resistance state of memory cell 310 may depend on the phase (e.g., crystalline or amorphous phase) of the material of memory element 333. A current (e.g., write current) applied to memory element 333 may cause at least a portion of its material to change between different phases such as between crystalline and amorphous phases.

For example, during a write operation, a memory device (where memory cell 310 may reside) may apply a current (e.g., write current) to memory cell 310 to heat at least a portion of the material of memory element 333 to a temperature above its melting point temperature Tm. The memory device may then allow the material of memory element 333 to cool rapidly, resulting in at least a portion (the melted portion) of the material to be in an amorphous phase corresponding to a resistance state with a resistance value that may represent a value of the information stored in memory cell 310. A different value of the current used during the write operation may result in a different resistance value. Thus, depending on the value of the information to be stored in memory cell 310, the memory device may use one of various values for the current during a write operation to cause memory cell 310 to have an appropriate resistance value to reflect the value of the information to be stored therein. To change the memory element from an amorphous phase to a crystalline phase, the memory device may apply a current to heat at least a portion of the material of memory element 333 to a temperature above its crystallization temperature Tc but below its melting point temperature Tm. The memory device may then hold the material at some temperature for a time sufficient to allow the material to crystallize (e.g., allow the amorphized portion to recrystallize). After the crystallization, the material may have a crystallized phase corresponding to a resistance state with a resistance value that may represent a value of the information stored in memory cell 310. The memory device may apply a current (e.g., read current) to read the information stored in memory cell 310 in ways similar to or identical to a read operation described above with reference to FIG. 2.

In FIG. 3, access component 344 may allow access to memory element 333 during a read or write operation. Access component 344 may have an on-state and an off-state. FIG. 3 shows an example where access component 344 has an on-state. In the on-state, access component 344 may include one or more conduction paths, such as a conduction path 399 (continuous conduction path) formed between electrodes 302 and 303, to allow conduction of current through memory element 333 and between lines 323 and 324. In the off-state, conduction path 399 may break or become discontinuous (not shown in FIG. 3) and prevent conduction of current through memory element 333 and between lines 323 and 324. Thus, access component 344 has a higher resistance in the off-state to prevent conduction of current and a lower resistance in the on-state to allow conduction of current.

Access component 344 may switch between the off-state (e.g., higher resistance) and the on-state (e.g., lower resistance) based on the voltage values of signals Vx and Vy. For example, a difference in voltage values (e.g., voltage potentials) between signals Vx and Vy may be set to a positive value with respect to line 323 to switch access component 344 to the on-state when memory cell 310 is selected to be read or written. The difference in voltage values between signals Vx and Vy may be set to a negative value with respect to line 323 when memory cell 310 is not selected to be read or written.

Access component 344 may include a material that excludes silicon (non-silicon based material), e.g., ion conducting chalcogenide material, binary metal oxide material, perovskite oxide material. In the on-state, ions (e.g., positively charged ions) of one of the materials of access component 344, such as ions 388, may migrate into other materials to form an ionic conduction path 399. As shown in FIG. 3, conduction path 399 may include ions 388 forming a continuous path between electrodes 302 and 303 to conduct current when access component 344 is in the on-state. In the off-state, the continuity of conduction path 399 may be broken (e.g., conduction path 399 includes a discontinuous segment), thereby preventing conduction of current between electrodes 302 and 303.

In memory cell 310, electrodes 301, 302, and 303 may serve as contacts and help pass current through memory element 333 and access component 344. Examples of the material of electrodes 301, 302, and 303 may include refractory metal nitride, carbides and borides such as TiN, ZrN, HfN, VN, NbN, TaN, TiC, ZrC, HfC, VC, NbC, TaC, TiB2, ZrB2, HfB2, VB2, NbB2, TaB2, Cr3C2, Mo2C, WC, CrB2, Mo2B5, W2B5; compounds such as TiAlN, TiSiN, TiW, TaSiN, TiCN, SiC, B4C, WSix, MoSi2; metal alloys such as NiCr; and elemental materials such as doped silicon, carbon, platinum, niobium, tungsten, molybdenum.

As described above, memory element 333 may include a phase change material. Some phase change materials may include chalcogenide materials with various combinations of germanium (Ge), antimony (Sb), tellurium (Te), and other similar materials. Examples of phase change materials may include binary combinations such as germanium telluride (GeTe), indium selenide (InSe), antimony telluride (SbTe), gallium antimonide (GaSb), indium antimonide (InSb), arsenic telluride (AsTe), aluminum telluride (AlTe); ternary combinations such as germanium antimony telluride (GeSbTe, e.g., $Ge_2Sb_5Te_5$), tellurium germanium arsenide (TeGeAs), indium antimony telluride (InSbTe), tellurium tin selenide (TeSnSe), germanium selenium gallide (GeSeGa), bismuth selenium antimonide (BiSeSb), gallium selenium telluride (GaSeTe), tin antimony telluride (SnSbTe), indium antimony germanide (InSbGe); and quaternary combinations such as tellurium germanium antimony sulfide (TeGeSbS), tellurium germanium tin oxide (TeGeSnO), and alloys of tellurium germanium tin gold, palladium tellurium germanium tin, indium selenium titanium cobalt, germanium antimony tellurium palladium, germanium antimony tellurium cobalt, antimony tellurium bismuth selenium, silver indium antimony tellurium, germanium antimony selenium tellurium, germanium tin antimony tellurium, germanium tellurium tin nickel, germanium tellurium tin palladium, and germanium tellurium tin platinum, and others. Among the phase change materials listed herein, some may provide an appropriate choice over the others depending in part on the application of the device. For example, $Ge_2Sb_5Te_5$ (germanium antimony telluride) may be an appropriate choice for a phase change memory device, in part, because of its relatively quick switching speed (e.g., a few nanoseconds) between different resistance states. Most of the material compositions in this description list only the component elements. The relative amount of each component element in each of these material compositions is not limited to a particular value.

The above description uses phase change materials for memory element 333 only as example materials. Memory element 333 and other memory elements described herein may include other unipolar switching memory materials besides phase change materials. Unipolar switching memory materials include materials that can switch in resistance such that they can have one resistance (e.g., resistance corresponding to one value of information) when one voltage is applied to the material in one direction and another resistance (e.g., resistance corresponding to another value of information) when another voltage with the same polarity is applied to the material in the same direction.

As described above, access component 344 may include material excluding silicon such as ion conducting chalcogenide material, binary metal oxide material, or perovskite oxide material. Access component 344 may also include other bipolar switching materials. Bipolar switching materials include materials that can switch in resistance such that they can turn on to have an on-resistance state (e.g., state to allow conduction of current) when a voltage with a polarity is applied to the material in one direction and turn off to have an off-resistance state (e.g., state to prevent conduction of current) when another voltage with the opposite polarity is applied to the material in the same direction. The on-resistance state may stay when the voltage is being applied or disappear when the voltage is removed. Thus, the bipolar switching materials used herein may or may not include switching memory materials.

The perovskite oxide material of access component 344 may include one of strontium titanium oxide (SrTiO), strontium zirconium oxide (SrZrO), and barium titanium oxide (BaTiO).

The binary metal oxide material of access component 344 may include one of hafnium oxide (HfO), nobium oxide (NbO), aluminum oxide (AlO), tunstung oxide (WO), titantalum oxide (TaO), titanium oxide (TiO), zirconium oxide (ZrO), copper oxide (CuO), iron oxide (FeO), and nickel oxide (NiO).

The ion conducting chalcogenide material of access component 344 may include a chalcogenide based material doped with a material (e.g., metal). The ion conducting chalcogenide material may use ions (e.g., positively charged ions) to form one or more conduction paths (such as conduction path 399 of FIG. 3) to change the resistance of access component 344 between different resistance values when appropriate values (e.g., voltage values) of the signals are applied across access component 344. For example, the ion conducting chalcogenide material may be a silver-doped or copper-doped chalcogenide material, such as silver-doped germanium selenide, copper-doped germanium selenide, silver-doped germanium sulfide, or copper-doped germanium sulfide. Each of these silver-doped and copper-doped chalcogenide materials may include multiple layers. For example, access component 344 may include multiple layers of materials between electrodes 302 and 303 in which the multiple layers may include silver-doped germanium selenide having a layer of germanium selenide (GeSe), a layer of copper selenide (CuSe), silver selenide (AgSe) or tin selenide (SnSe), a layer of germanium selenide (GeSe), a layer of silver (Ag), and a layer of germanium selenide (GeSe). In another example, access component 344 may include multiple layers in which the multiple layers may include silver-doped germanium sulfide having a layer of germanium sulfide (GeS), a layer of silver selenide (AgSe) or tin selenide (SnSe) or copper selenide (CuSe), a layer of germanium sulfide (GeS), a layer of silver (Ag), and a layer of germanium sulfide (GeS).

The example materials of access component 344 and the materials of memory element 333, such as those listed above, may have similar process temperature tolerances. Therefore, processes of making a memory cell such as memory cell 310 may be improved in comparison to those of making a conventional memory cell where the material of the access component and the material of the memory element may have different process temperature tolerances.

Figure 4:
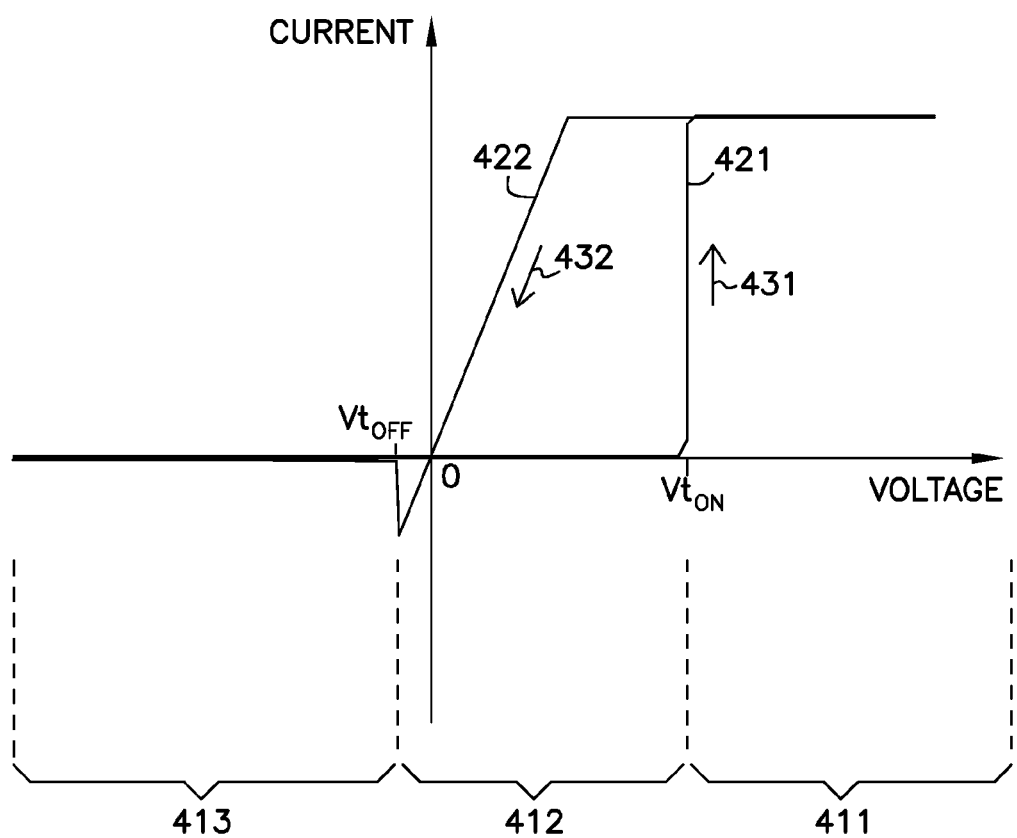
FIG. 4 is an example embodiment of current versus voltage (I-V) characteristics of an access component of the memory cell of FIG. 3.

FIG. 4 is an example embodiment illustrating a graph of I-V characteristics showing on-state and off-state of access component 344 of memory cell 310 of FIG. 3. FIG. 4 shows two voltage values: voltage value $Vt_{ON}$ greater than zero, and voltage $Vt_{OFF}$ less than zero. Voltage values $Vt_{ON}$ and $Vt_{OFF}$ may correspond to threshold voltage values of access component 344. Access component 344 may turn on or off based on the relationship among voltage values shown in expression (1) and (2) below.

$$\text{Access component 344 may turn on when} \quad Vx-Vy>Vt_{ON}>0. \quad (1)$$

$$\text{Access component 344 may turn off when} \quad Vx-Vy<Vt_{OFF}<0. \quad (2)$$

Expression (2) may be rewritten as expression (3):

$$Vy-Vx>Vt'_{OFF}>0 \text{(where } Vt'_{OFF}=-Vt_{OFF}.) \quad (3)$$

In expression (1), the difference between Vx and Vy (Vx minus Vy) may be considered as a voltage difference (Vx–Vy) in a first direction (e.g., direction from line 323 to line 324 in FIG. 3) across memory element 333 and access component 344. Thus, based on expression (1), access component 344 may turn on when a voltage difference (Vx–Vy) in a first direction across memory element 333 and access component 344 exceeds voltage value $Vt_{ON}$ and is greater than zero volts. As described above with reference to FIG. 3, access component 344, when turned on, may allow conduction of current through memory element 333 or access component 344 (or both).

In expression (2), the difference between Vx and Vy is less than $Vt_{OFF}$ and less than zero volts. Thus, the difference (Vx–Vy) is a negative value in the first direction. However, instead of describing expression (2) in terms of the negative value in a first direction, the description herein may alternatively use expression (3) to describe an equivalent of expression (2) in terms of a positive value in an opposite direction (e.g., second direction).

In expression (3), the difference between Vy and Vx (Vy minus Vx) may be considered as a voltage difference (Vy–Vx) in a second direction (e.g., direction from line 324 to line 323 in FIG. 3) across memory element 333 and access component 344. Thus, based on expression (3), access component 344 may turn off when a voltage difference (Vy–Vx) in a second direction across memory element 333 and access component 344 exceeds voltage value $Vt'_{OFF}$ and is greater than zero volts. As described above with reference to FIG. 3, access component 344, when turned off, may prevent conduction of current through memory element 333 or access component 344 (or both). In other words, as shown in expression (2), access component 344 may turn off when Vx–Vy is a negative value less than $Vt_{OFF}$.

Depending on the material of access component 344, voltage value $Vt_{ON}$ may have an absolute value that is about 2 to 2.5 times greater than the absolute value of voltage value $Vt_{OFF}$. For example, when access component 344 has a material such as the material of access component 544 of FIG. 5, voltage value $Vt_{ON}$ may have a value of about 0.25 volt and voltage value $Vt_{OFF}$ may have a value of about negative 0.1 (−0.1) volt.

FIG. 4 also shows regions 411, 412, and 413, and curves 421 and 422. Region 411 may include voltage values from $Vt_{ON}$ and greater. Region 413 may include voltage values from $Vt_{OFF}$ and lower. Region 412 may include a voltage value between $Vt_{ON}$ and $Vt_{OFF}$. Access component 344 may be configured to operate in the on-state corresponding to region 411 (e.g., Vx−Vy>$Vt_{ON}$>0) and in the off-state corresponding to region 413 (e.g., Vx−Vy<$Vt_{OFF}$<0). Region 412 may be called a hysteresis switching region of access component 344 where access component 344 may be in either the on-state or the off-state.

Curve 421 in FIG. 4 may show the relationship between voltage and current of access component 344 when access component 344 switches from an off-state to an on-state. For example, when access component 344 is in an off-state (e.g., conduction path 399 in FIG. 3 may be broken) and when line 324 is coupled to a ground potential (e.g., Vy=0), access component 344 may turn on and switch from the off-state (region 413 in FIG. 4) to the on-state (region 411) to allow conduction of current (indicated by current flow direction 431) when the voltage value of line 323 (e.g., Vx) is greater than $Vt_{ON}$ (Vx>$Vt_{ON}$).

Curve 422 in FIG. 4 may show the relationship between voltage and current of access component 344 when access component 344 switches from an on-state to an off-state. For example, when access component 344 is in an on-state (e.g., conduction path 399 in FIG. 3 is continuous) and when line 323 is coupled to a ground potential (e.g., Vx=0), access component 344 may turn off and switch from the on-state (region 411 in FIG. 4) to the off-state (region 413) to prevent conduction of current when the voltage value of line 324 (e.g., Vy) is greater than $Vt'_{OFF}$ (Vy>$Vt'_{OFF}$). As shown by the portion of curve 422 in region 412, some amount of current (indicated by current flow direction 432) may follow through access component 344 when access component 344 is in region 412 (hysteresis switching region) during switching from region 411 (on-state) to region 413 (off-state). However, when the voltage value of Vy is greater than $Vt'_{OFF}$, access component 344 may leave region 412 and switch to region 413 and prevent conduction of current. As shown by portion of curve 422 in region 413 (off-state), the value of current may be substantially small or equal to zero.

Besides the characteristics such as the material and the functions described above with reference to FIG. 3 and FIG. 4, access component 344 may include at least the following characteristics. Access component 344 may switch between the off-state and the on-state in a relatively shorter time (e.g., in about one nanosecond for material such as silver-doped chalcogenide) than that of memory element 333. Access component 344 may be turned off by a relatively smaller amount of current than a write current to write memory element 333, and may have a relatively large ratio of on current (Ion) to off current (Ioff), e.g., Ion/Ioff ratio of few hundred micro-amperes/pico-amperes range. Access component 344 may have a resistance of a few kilo-ohms when it is in the on-state, and a resistance of about more than one mega-ohms when it is in an off-state. The characteristics of access component 344, as described above, may enable it to be useful as access component to allow or prevent conduction of current to and from memory element 333.

In memory cell 310 of FIG. 3, access component 344 and memory element 333 may include materials having similar process temperature tolerance. Therefore, memory cell 310, having access component 344 and memory element 333 as described above, may provide a suitable option to form a memory device with multiple device levels where memory cells may be stacked in the multiple device levels to increase storage density. In some conventional memory devices, the access component (comparing to access component 344) and the memory element (comparing to memory element 333) of the memory cell may include different process temperature tolerances; therefore, forming multiple device levels of memory cells in a conventional device may pose challenges. For example, in a conventional device, the memory element may have a lower process temperature tolerance than that of the access component (e.g., silicon-based access component). Therefore, thermal damage to the memory element in the lower device level may occur when the access component in a higher device level is formed. In contrast, as described above, since access component 344 and memory element 333 of FIG. 3 may include materials having similar process temperature tolerances, thermal damage may be avoided when multiple device levels of memory cells are formed.

FIG. 5 shows cross-section of a memory cell 510 including an access component 544 having ion conducting chalcogenide material according to various embodiments of the invention. Memory cell 510 may also include electrodes 501, 502, and 503, and a memory element 555 coupled in series with access component 544 between electrodes 501 and 503. As shown in FIG. 5, access component 544 may include an example of multiple layers 561, 562, 563, 564, and 565 with example materials such as germanium selenide (e.g., $Ge_4Se_6$) for layer 561, silver selenide ($Ag_2Se$) or tin selenide (SnSe) for layer 562, germanium selenide (e.g., $Ge_4Se_6$) for layer 563, silver (Ag) for layer 564, and germanium selenide (e.g., $Ge_4Se_6$) for layer 565. The materials of access component 544 shown in FIG. 5 may be considered an example of a silver-doped chalcogenide material. FIG. 5 shows the ion conducting chalcogenide material for access component 544 being silver-doped chalcogenide as an example. Access component 544, however, may include another chalcogenide material doped with another material (besides silver).

Layers 561, 562, 563, 564, and 565 of access component 544 may have thicknesses of about 15 nm (nanometers), about 47 nm, about 15 nm, about 20 nm, and about 10 nm, respectively. The term "about" with respect to a specific thickness value means that the thickness may be less than or greater than the specific thickness value by a margin. The margin may have a value equal from one percent (%) to 20% of the specific value. Access component 544 may include other thickness values for layers 561, 562, 563, 564, and 565. However, the specific example thickness values described herein may improve at least one of a switching time between on-state and off-state and a reduction in resistance of access component 544 in the on-state. Access component 544 may include fewer or more layers than those shown in FIG. 5, with materials similar to or identical to those of the materials of access component 344 of FIG. 3. Electrodes 501, 502, and 503 may include materials similar to or identical to those of electrodes 301, 302, and 303 of FIG. 3.

Access component 544 may include I-V characteristics similar to or identical to that of access component 344 of FIG. 4. For example, access component 544 may have an on-state when electrodes 501 and 503 have appropriate voltage values (e.g., voltage values that may satisfy expression (1) above) and an off-state when electrodes 501 and 503 have other appropriate voltage values (e.g., voltage values that may satisfy expression (2) above). In the on-state, silver ions (Ag$^+$) from the silver-doped chalcogenide material of access component 544 may form a conduction path between electrodes 502 and 503 to allow conduction of current through access component 544 and memory element 555. In the off-state, the conduction path formed by the silver ions may break and prevent conduction of current through access component 544 and memory element 555.

FIG. 6 shows a cross-section of a memory cell 610 including an access component 644 having binary metal oxide material according to an embodiment of the invention. Memory cell 610 may also include electrodes 601, 602, and 603, and a memory element 666 coupled in series with access component 644. Access component 644 may include materials similar to or identical to those of the binary metal oxide materials of access component 344 of FIG. 3. Access component 644 may include I-V characteristics similar to or identical to that of access component 344 of FIG. 4. For example, access component 644 may have an on-state when electrodes 601 and 603 have appropriate voltage values (e.g., voltage values that may satisfy expression (1) above) and an off-state when electrodes 601 and 603 have other appropriate voltage values (e.g., voltage values that may satisfy expression (2) above). In the on-state, ions or vacancies from the binary metal oxide material of access component 644 may form a conduction path between electrodes 602 and 603 to allow conduction of current through access component 644 and memory element 666. Examples of ions include copper ions Cu$^+$ if the binary metal oxide material is copper oxide, and iron ions Fe$^{2+}$ if the binary metal oxide material is iron oxide. An example of vacancies includes oxygen vacancies O$^{2-}$ if the binary metal oxide material is nickel oxide. In the off-state, the conduction path formed by the ions of the binary metal oxide (e.g., ions Cu$^+$ or Fe$^{2+}$, or O$^{2-}$ vacancies) may break and prevent conduction of current through access component 644 and memory element 666.

FIG. 7 shows a cross-section of a memory cell 710 including an access component having perovskite oxide material according to an embodiment of the invention. Memory cell 710 may also include electrodes 701, 702, and 703, and a memory element 777 coupled in series with access component 744. Access component 744 may include materials similar to or identical to those of the perovskite oxide materials of access component 344 of FIG. 3.

Figure 8:
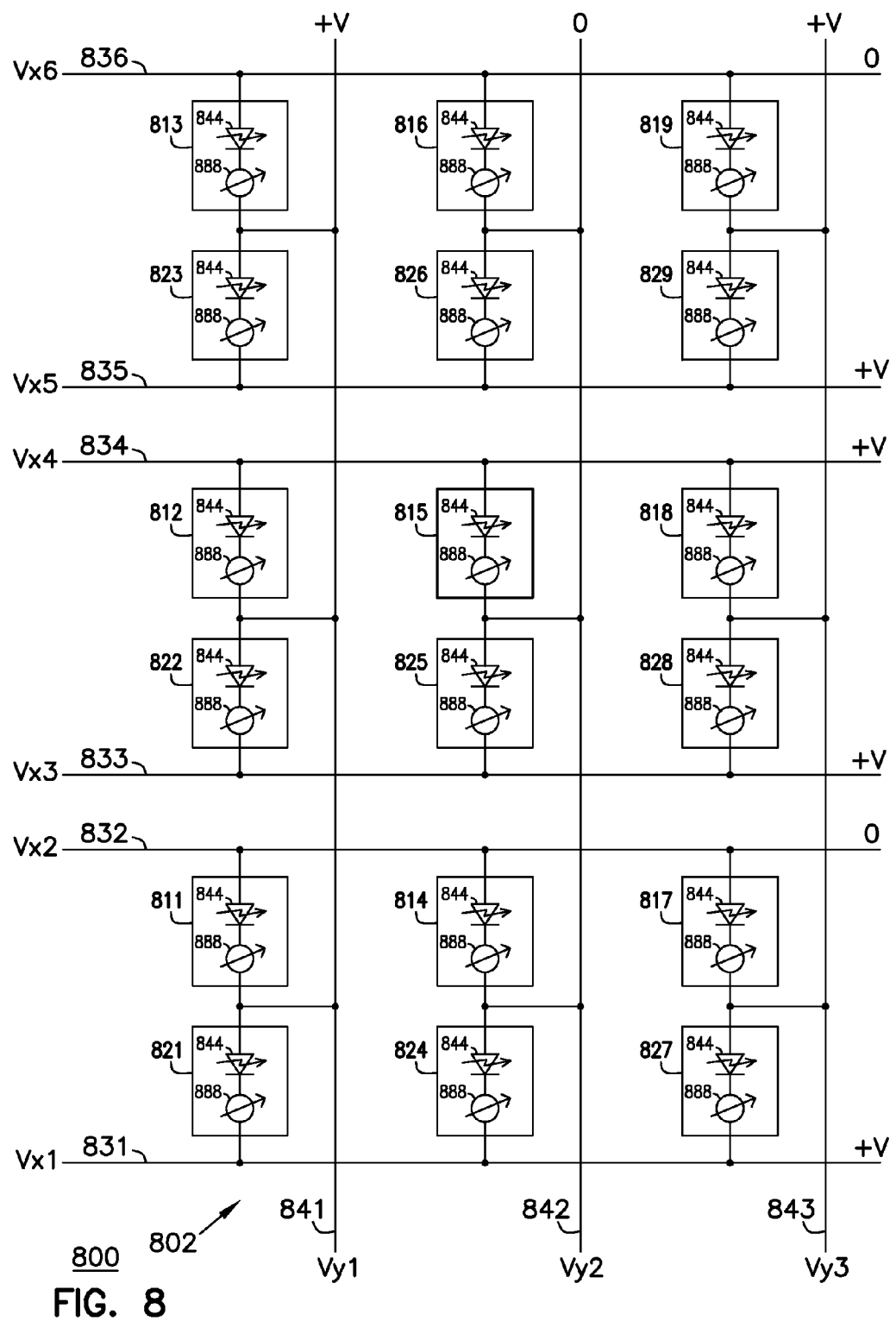
FIG. 8 shows a partial schematic diagram of a memory device having a memory array according to an embodiment of the invention.

FIG. 8 shows a partial schematic diagram of a memory device 800 having a memory array 802 according to an embodiment of the invention. Memory array 802 may include memory cells 811 through 819 and 821 through 829. These memory cells are collectively called "the" memory cells in FIG. 8. As shown in FIG. 8, each of the memory cells may include a memory element 888 and an access component 844, which may be similar to or identical to the memory element and the access component of memory cell 310, 510, 610, or 710 described above with reference to FIG. 3 through FIG. 7. In FIG. 8, memory device 800 may select the memory cells using signals Vx1, Vx2, Vx3, Vx4, Vx5, and Vx6 on lines 831, 832, 833, 834, 835, and 836, respectively, and signals Vy1, Vy2, and Vy3 on lines 841, 842, and 843, respectively. During a read or write operation, memory device 800 may use appropriate voltage values of signals Vx1 through Vx6 and Vy1 through Vy3 to turn on the access component of a selected memory cell that is to be read or written and turn off the access components of the unselected memory cells.

Access component 844 of each of the memory cells in FIG. 8 may include two threshold voltages having voltage values such as voltage values Vt$_{ON}$ and Vt$_{OFF}$ similar to or identical to those of access component 344 described above with reference to FIG. 4. In FIG. 8, access component 844 of the selected memory cell may turn on when the voltage difference across the selected memory cell with respect to a first direction (e.g., direction from access component 844 to memory element 888) is greater than Vt$_{ON}$. Access component 844 of each of the unselected memory cells may turn off when the voltage difference across each of the unselected selected memory cells with respect to a second direction (e.g., direction from memory element 888 to access component 844) is greater than Vt'$_{OFF}$ (or is less than Vt$_{OFF}$ if the voltage difference is considered with respect to the first direction).

The following example assumes that access component 844 of each of the memory cells is in an off-state, and that memory device 800 selects to access memory cell 815 to either read or write memory cell 815. In this example, memory device 800 may selectively use voltage values +V and 0 (as shown in FIG. 8) for signals Vx1 through Vx6 and Vy1 through Vy3, so that memory device 800 may turn on access component 844 of memory cell 815 (and then apply a read or write current through memory element 888) and keep access component 844 of each of the other memory cells in the off-state.

Voltage value +V in FIG. 8 may have a value greater than voltage value Vt$_{ON}$ and Vt'$_{OFF}$. Thus, in this example, the voltage difference across memory cell 815 is equal to the voltage (+V) on line 834 minus the voltage (zero) on line 842. Since voltage value +V is greater than Vt$_{ON}$, the voltage difference across memory cell 815 is greater than Vt$_{ON}$. Therefore, using the example voltage values of FIG. 8, memory device 800 may turn on access component 844 of selected memory cell 815. The voltage difference across unselected memory cell 825 is equal to the voltage (zero) on line 842 minus the voltage (+V) on line 833. Thus, the voltage difference across memory cell 825 is -V, which is less than Vt$_{OFF}$. Therefore, access component 844 of selected memory cell 825 may remain in the off-state.

The voltage values +V and zero are used in the example above only for ease of describing the example. Memory device 800 may use values besides zero volts such that the voltage difference across in the direction from access component 844 to memory element is greater than voltage value Vt$_{ON}$ for the selected memory cell and is less than Vt$_{OFF}$ for the unselected memory cell.

Memory device 800 may include multiple device levels such that a first group of the memory cells may be located on one device level and a second group of the memory cells may be located on another device level and stacked on the first group.

Figure 9:
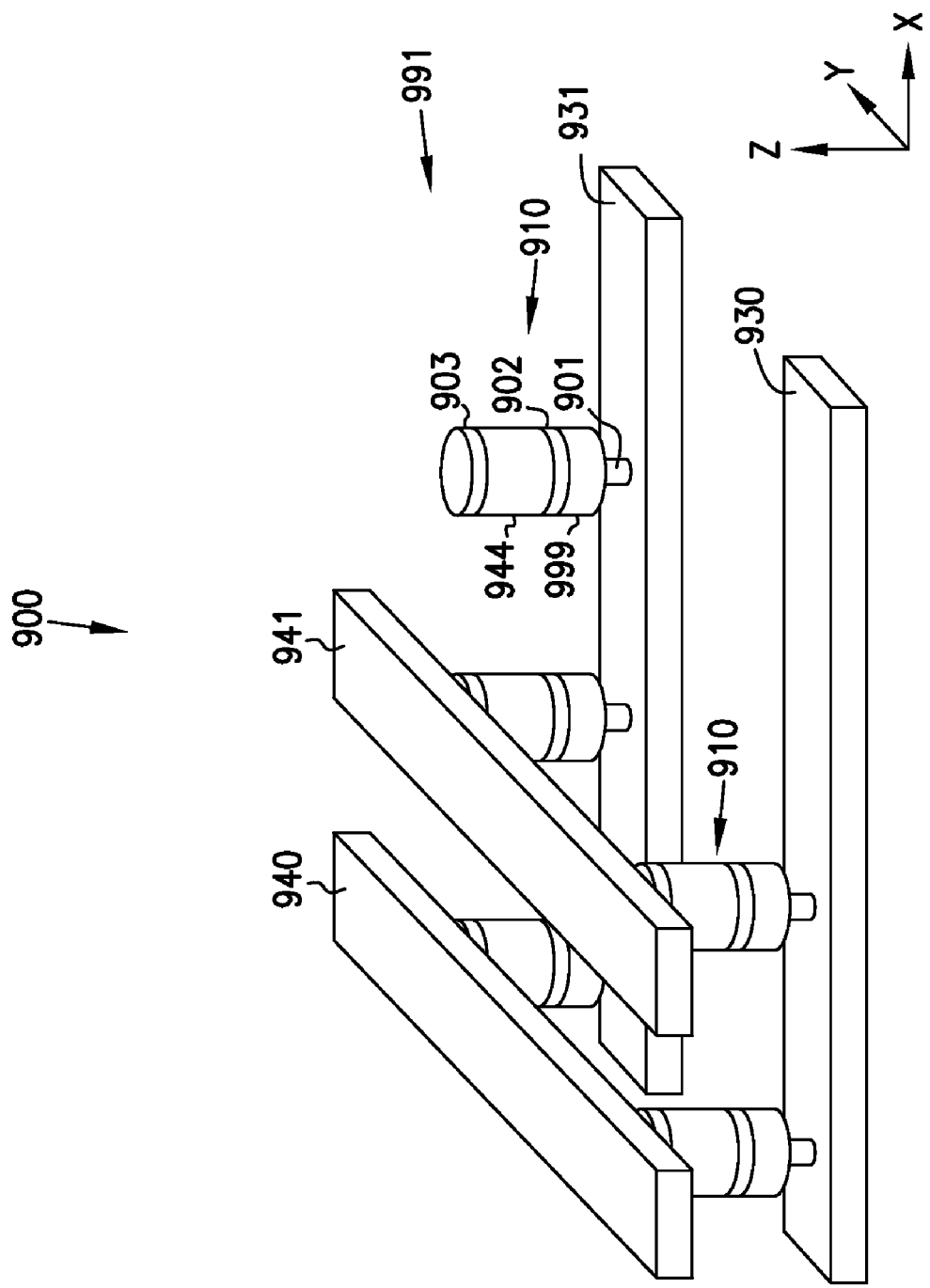
FIG. 9 shows a partial three-dimensional (3-D) view of a memory device having memory cells located on a single device level according to an embodiment of the invention.
Figure 10:
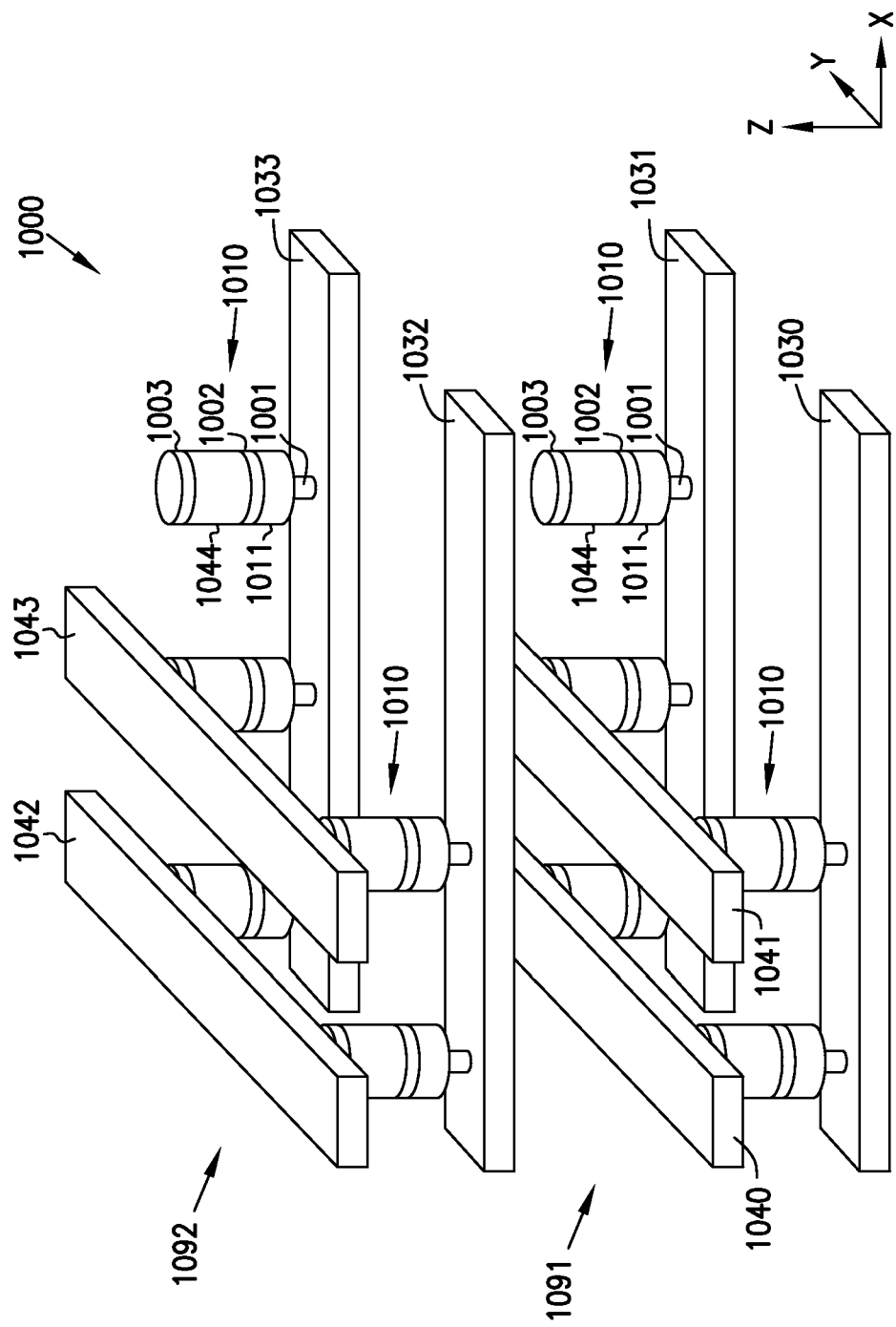
FIG. 10 shows a partial 3-D view of a memory device having memory cells stacked on multiple device levels according to an embodiment of the invention.
Figure 11:
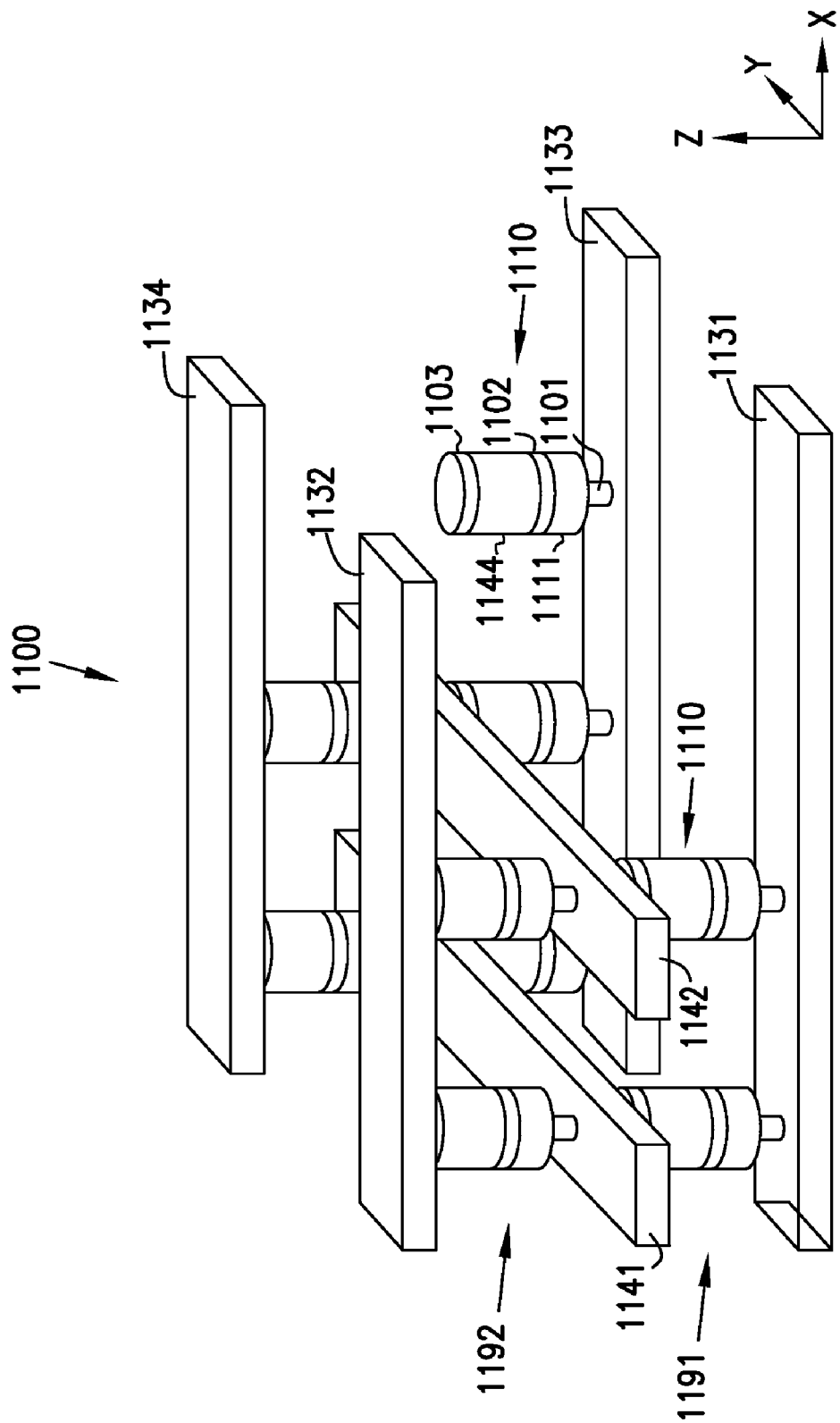
FIG. 11 shows a partial 3-D view of a memory device having memory cells stacked on multiple device levels with shared conduction lines between device levels according to an embodiment of the invention.

FIG. 9 through FIG. 11 show 3-D views of some memory devices with a single device level and multiple device levels.

FIG. 9 shows a partial 3-D view of a memory device 900 having memory cells 910 located on a single device level 991 according to an embodiment of the invention. FIG. 9 also shows x-y-z dimensions for ease of describing relative positions of the features of memory device 900. For example, as shown in FIG. 9, memory cells 910 may be arranged in rows and columns along the x-dimension and y-dimension, respectively, and may be located on device level 991 of the z-dimension.

Each memory cell 910 may include electrodes 901, 902, 903, and an access component 944 coupled in series with memory element 999 between line 930 or 931 and line 940 or 941. As shown in FIG. 9, electrodes 901, 902, and 903, access component 944, and memory element 999 of each memory cell 910 may have a cylindrical structure extending in the z-direction such that a cross-section of memory cell 910 (e.g., a cross-section of memory element 999, or access component 944, or each of electrodes 901, 902, and 903) parallel to the x-y plane may have a circular or substantially circular shape. The circular or substantially circular shape herein includes an elliptical or substantially elliptical shape. Memory element 999 may have other shapes.

Lines 930, 931, 940 and 941 of FIG. 9 may correspond to lines 230, 231, 240 and 241 respectively, of FIG. 2. In FIG. 9, lines 930, 931, 940, and 941 may include conductive material, such as metal (e.g., copper, aluminum, gold, or others), and may be called metal lines of memory device 900. Memory element 999 may include material similar to or identical to those of memory element 333 of FIG. 3, e.g., phase change material (such as chalcogenide) or other unipolar switching memory materials. Access component 944 may include materials similar to or identical to those of access component 344 of FIG. 4, e.g., ion conducting chalcogenide, binary metal oxide, or perovskite oxide, or other bipolar switching materials.

FIG. 10 shows a partial 3-D view of a memory device 1000 having memory cells 1010 stacked on multiple device levels 1091 and 1092 according to an embodiment of the invention. As shown in FIG. 10, device level 1092 may be stacked over device level 1091 in the z-dimension in which each of device levels 1091 and 1092 may includes a number of memory cells 1010 arranged in rows and columns along the x-dimension and y-dimension, respectively. Each memory cell 1010 may include electrodes 1001, 1002, and 1003, and an access component 1044 coupled in series with memory element 1011 between its respective lines (e.g., conductive lines such as metal lines) 1030, 1031, 1032, 1033, and 1040, 1041, 1042, and 1043. The materials of the features of memory device 1000, e.g., access component 1044 and memory element 1011, may be similar to or identical to those of memory device 900 of FIG. 9. Lines 1030, 1031, 1040, and 1041 of FIG. 10 may correspond to lines 230, 231, 240 and 241 respectively, of FIG. 2. Lines 1032, 1033, 1042, and 1043 of FIG. 10 may correspond to lines 230, 231, 240 and 241 respectively, of FIG. 2.

FIG. 11 shows a partial 3-D view of a memory device 1100 having memory cells stacked on multiple device levels with shared conduction lines between device levels according to an embodiment of the invention. As shown in FIG. 11, device level 1192 may be stacked over device level 1191 in the z-dimension in which each of device levels 1191 and 1192 may include a number of memory cells 1110 arranged in rows and columns along the x-dimension and y-dimension, respectively. Each memory cell 1110 may include electrodes 1101, 1102, 1103, and an access component 1144 coupled in series with memory element 1111 between its respective lines (e.g., conductive lines such as metal lines) 1131, 1133, 1132, or 1134, and 1141 or 1142. Lines 1131, 1133, 1132, and 1134 of FIG. 11 may correspond to lines 831, 833, 832, and 834, respectively, of FIG. 8. Lines 1141 and 1142 of FIG. 11 may correspond to lines 841 and 842, respectively, of FIG. 8. In FIG. 11, the materials of the features of memory device 1100, e.g., access component 1144 and memory element 1111, may be similar to or identical to those of memory device 900 of FIG. 9. As shown in FIG. 11, two memory cells 1110 from different device levels may share the same line, such as lines 1141 or 1142. Sharing the same line 1141 or 1142 may reduce device size and simplify fabrication process.

FIG. 12 through FIG. 17 show various processes of forming a memory device 1200 according to an embodiment of the invention. Memory device 1200 (shown in more details in FIG. 17) may correspond to memory device 900 of FIG. 9. In FIG. 12 through FIG. 17, the cross-section view of the features of memory device 1200 may correspond to a cross-section view of similar features shown in memory device 900, looking in the y-dimension (or into the paper) of FIG. 9. For clarity, FIG. 12 through FIG. 17 include cross-section lines for only some of the features therein.

Figure 12:
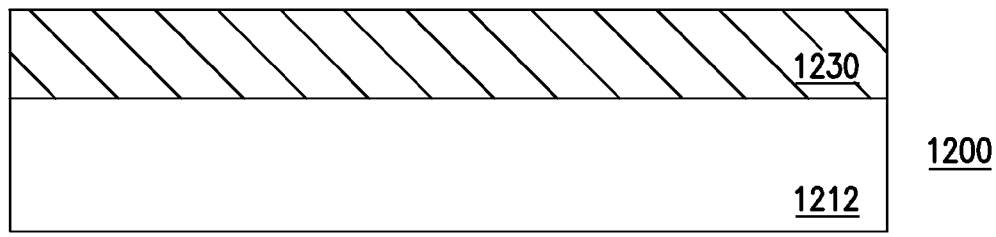
FIG. 12 through FIG. 17 show various processes of forming a memory device having memory cells according to an embodiment of the invention.

As shown in FIG. 12, a conductive line 1230 has been formed over a substrate 1212. As used herein, the term "on" used with respect to two or more materials, one "on" the other, means at least some contact between the materials, while "over" means the materials are in close proximity, but possibly with one or more additional intervening materials such that contact is possible but not required. Neither "on" nor "over" implies any directionality as used herein unless stated as such. In FIG. 12, substrate 1212 may include material such as tetraethoxysilane (TEOS), or silicon nitride, or other insulation material. Forming conductive line 1230 may include depositing a layer of material over substrate 1212 and patterning the layer to form conductive line 1230. Alternatively, forming conductive line 1230 may include a damascene process. The material of conductive line 1230 may be similar to or identical to those of line 930 of FIG. 9. Conductive line 1230 may have a greater dimension (e.g., length) extending along the x-dimension similar to the x-dimension of FIG. 9.

Figure 13:
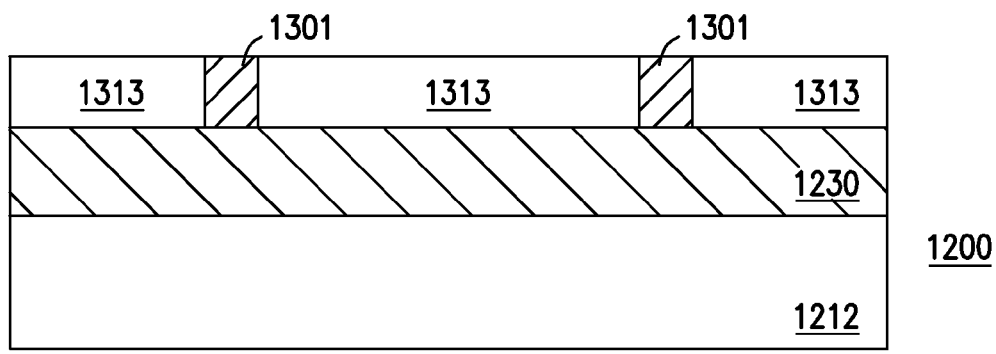

In FIG. 13, an insulator 1313 and electrodes 1301 have been formed. Forming insulator 1313 may include depositing an insulation material over substrate 1212 followed by a polishing process such as chemical mechanical polishing (CMP) planarization. Forming electrodes 1301 may include removing some portions of insulator 1313 and depositing material in the removed portion of insulator 1313. The material of electrodes 1301 may be similar to or identical to electrode 301 of FIG. 3.

Figure 14:
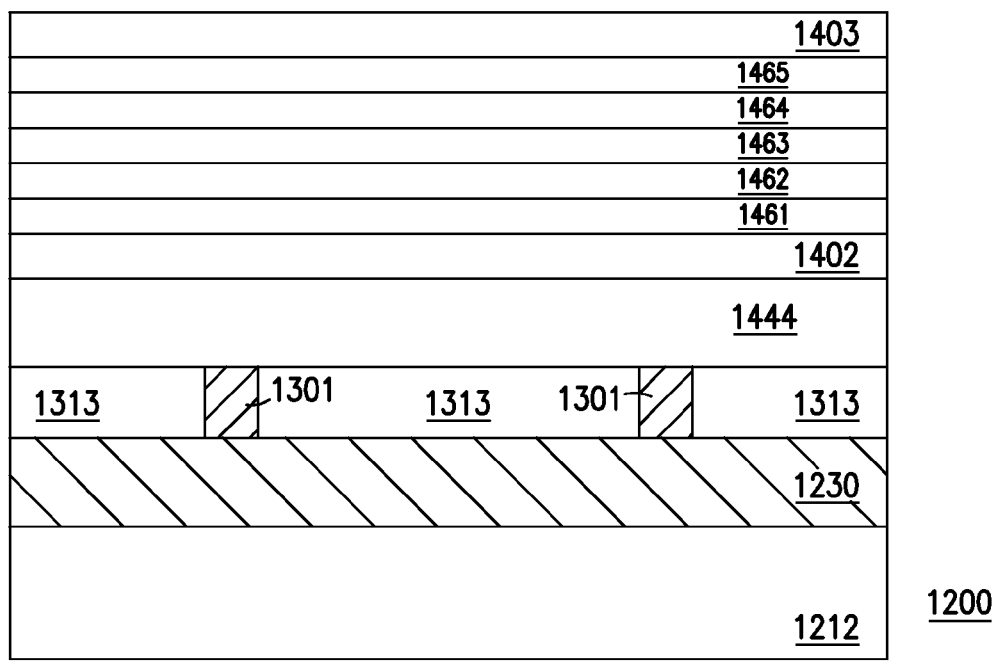

In FIG. 14 multiple layers 1444, 1402, 1461, 1462, 1463, 1464, 1465, and 1403 have been formed. Forming these multiple layers may include depositing layer 1444 directly contacting electrodes 1301, and depositing the other layers 1402, 1461, 1462, 1463, 1464, 1465, and 1403 over layer 1444. Layer 1444 may include materials similar to or identical to those of memory element 333 of FIG. 3; layers 1402 and 1403 may include materials similar to or identical to those of electrodes 302 and 303, respectively, of FIG. 3; and layers 1461, 1462, 1463, 1464, and 1465 may include materials similar to or identical to those of layers 561, 562, 563, 564, and 565, respectively, of access component 555 of FIG. 5.

Figure 15:
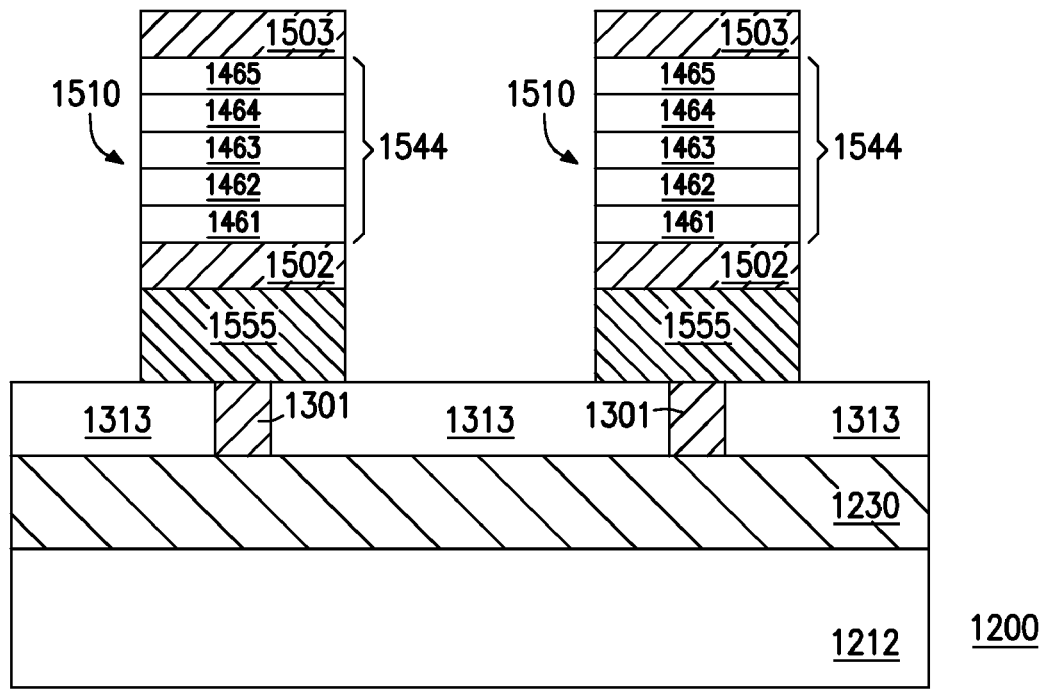

In FIG. 15, memory cells 1510 have been formed. Forming memory cells 1510 may include patterning layers 1444, 1402, 1461, 1462, 1463, 1464, 1465, and 1403 of FIG. 14 into mesas or pillars (as shown FIG. 15) that may form a part of memory cells 1510. Each of memory cells 1510 may include electrodes 1301, 1502, and 1503, memory element 1555, and access component 1544 having multiple layers 1461, 1462, 1463, 1464, and 1465 of FIG. 14 that have been patterned in FIG. 15. FIG. 14 shows five layers 1461, 1462, 1463, 1464, and 1465 as an example. Forming access component 1544 may alternatively include forming fewer or more than five layers so that access component 1544 (FIG. 15) may include material similar to or identical to those of access component 344 of FIG. 3.

Figure 16:
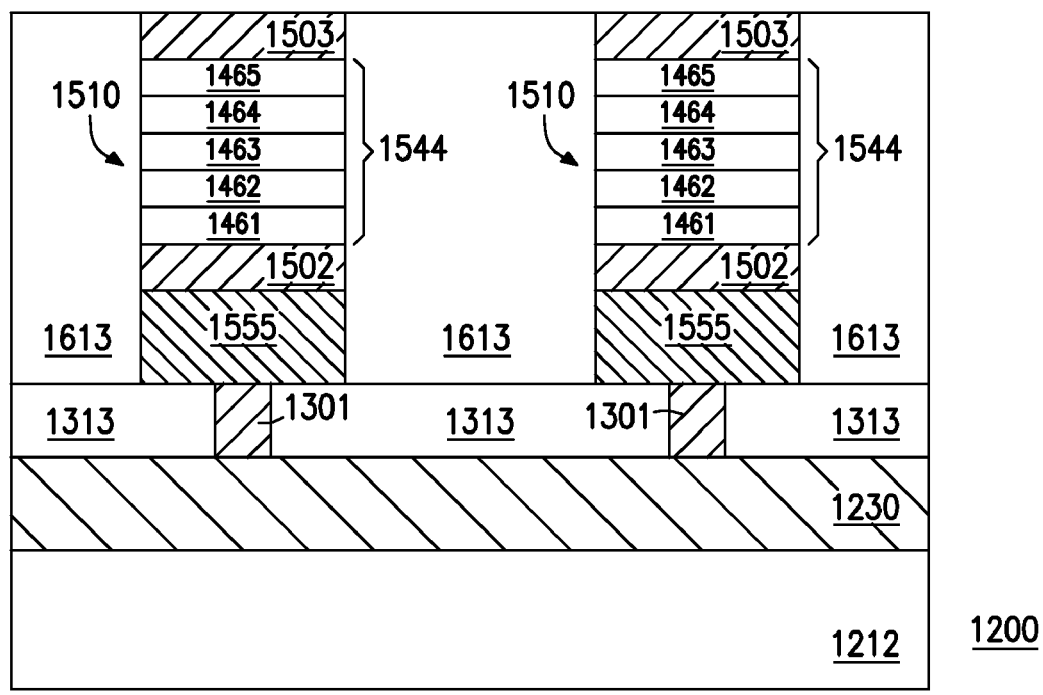

In FIG. 16, an insulator 1613 has been formed. Forming insulator 1613 may include depositing an insulator material over the features of memory cells 1510 of FIG. 15 and then performing a polishing process, such as CMP. The polishing process may stop on electrodes 1503. Alternatively, an additional thin encapsulating layer (e.g., silicon nitride) may be formed before insulator 1613 is formed to protect memory cells 1510.

Figure 17:
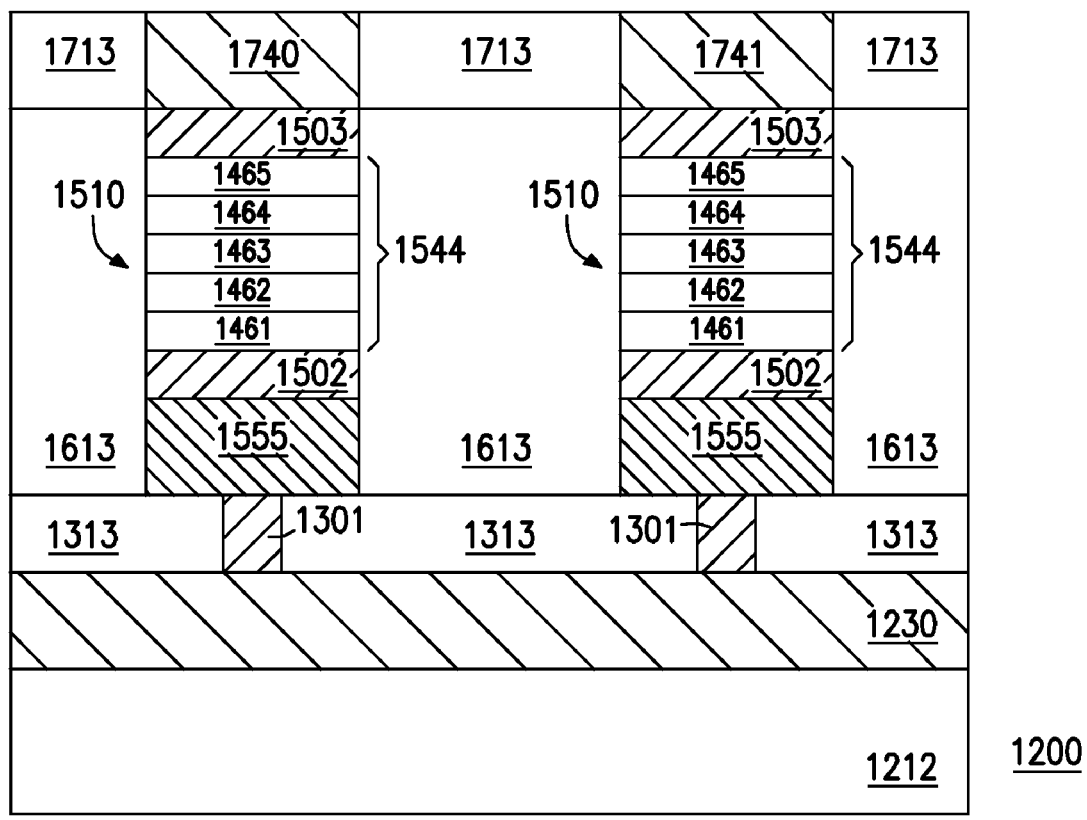

In FIG. 17, conductive lines 1740 and 1741 and an insulator 1713 have been formed. Forming conductive lines 1740 and 1741 may include depositing a conductive material over insulator 1613 and electrodes 1503, and patterning the conductive material to form conductive lines 1740 and 1741 such that conductive lines 1740 and 1741 may be perpendicular (or substantially perpendicular) to conductive line 1230. Alternatively, forming conductive lines 1740 may include a damascene process. Forming insulator 1713 may include depositing an insulation material over insulator 1613 and conductive lines 1740 and 1741, and then performing a polishing process, such as CMP. The polishing process may stop on conductive lines 1740 and 1741. The material of conductive lines 1740 and 1741 may be similar to or identical to those of line 940 and 941 of FIG. 9. In FIG. 17, each of conductive lines 1740 and 1741 may have a greater dimension (e.g., length) extending along the y-dimension similar to the y-dimension of FIG. 9.

Figure 18:
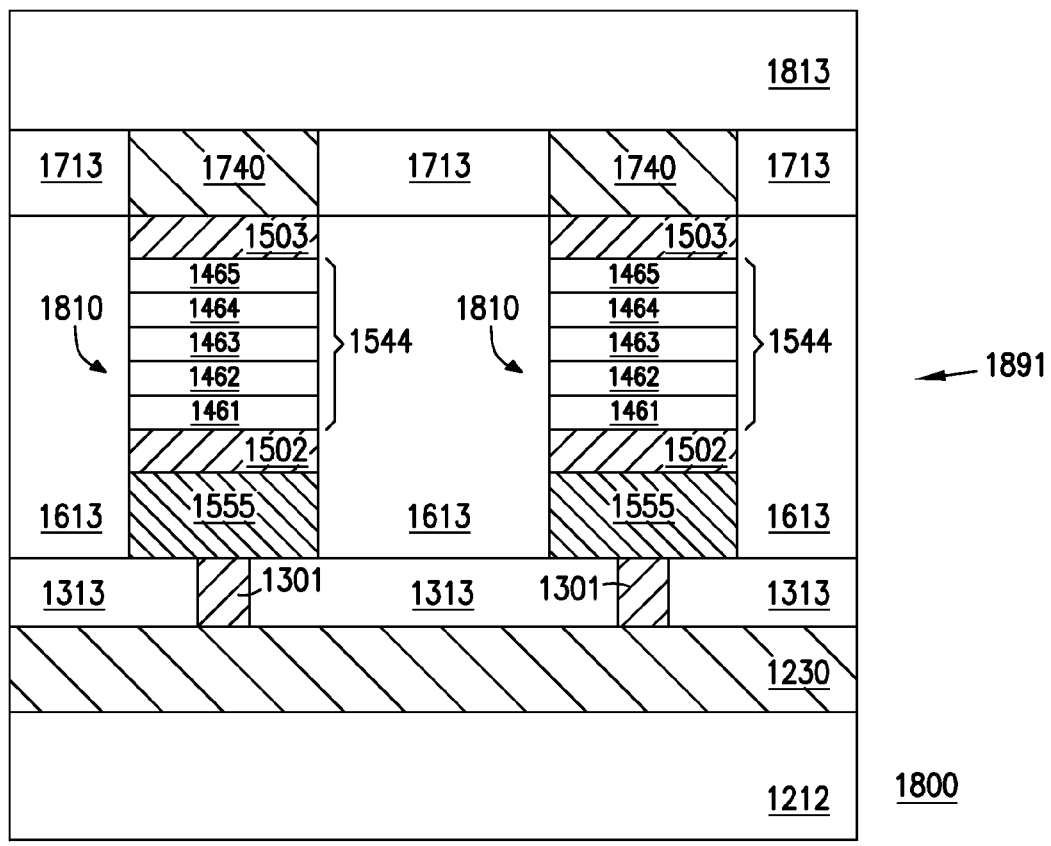
FIG. 18 and FIG. 19 show various processes of forming a memory device having multiple device levels according to an embodiment of the invention.
Figure 19:
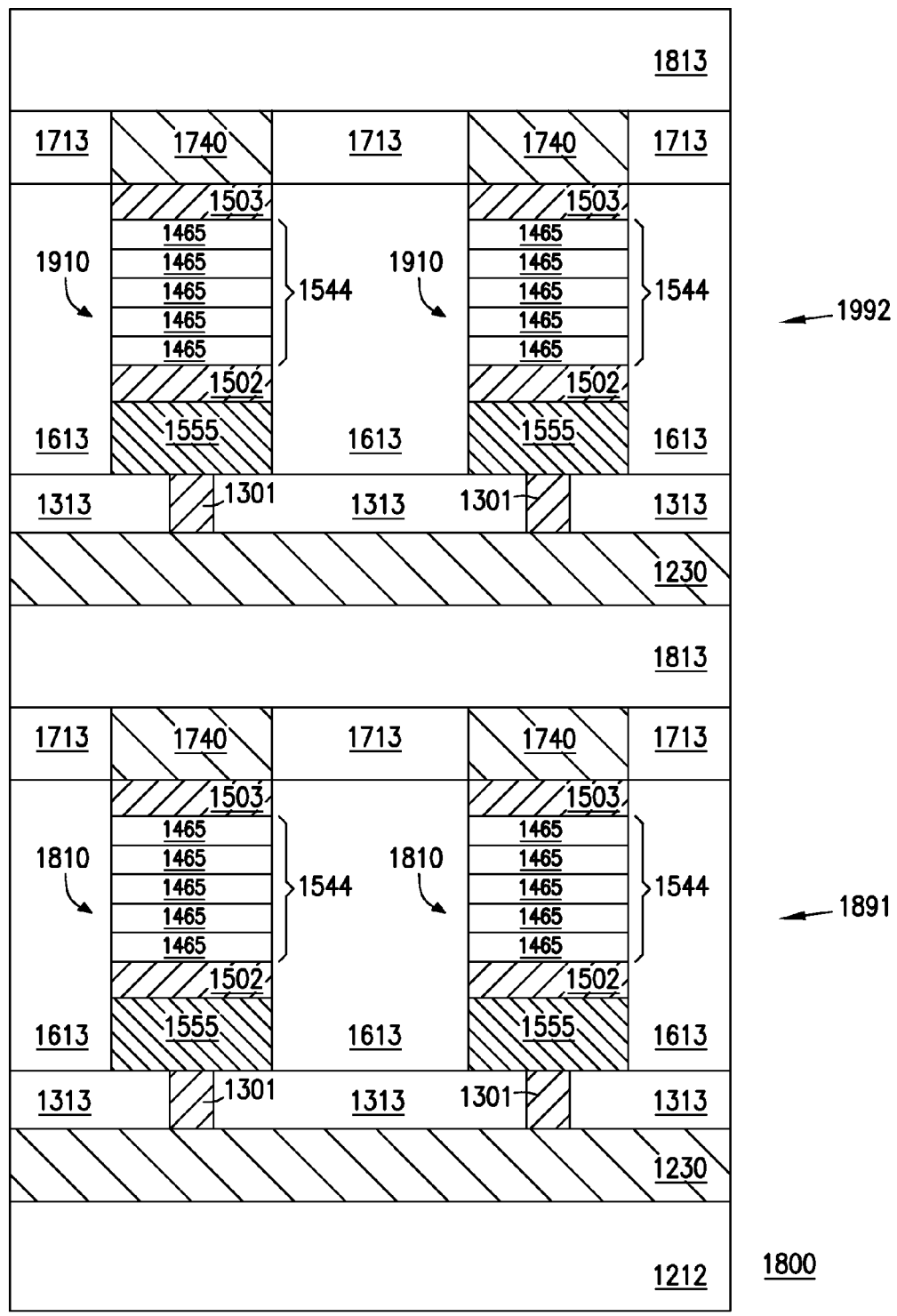

FIG. 18 and FIG. 19 show various processes of forming a memory device 1800 having multiple device levels according to an embodiment of the invention. Memory device 1800 (shown in more details in FIG. 19) may correspond to memory device 1000 of FIG. 10. In FIG. 18 and FIG. 19, the cross-section view of the features of memory device 1800 may correspond to a cross-section view of similar features shown in memory device 1000, looking in the y-dimension of FIG. 10. For clarity, FIG. 18 and FIG. 19 include cross-section lines for only some of the features therein.

In FIG. 18, device level 1891 having memory cells 1810 has been formed. Forming device level 1891 may include processes similar to or identical to those of the processes described above with reference to FIG. 12 through FIG. 17. Thus, similar or identical features among FIG. 12 through FIG. 17 and FIG. 18 and FIG. 19 have the same reference numbers. In FIG. 18, an insulator 1813 has been formed over device level 1891. Forming insulator 1813 may include depositing an insulation material over device level 1891.

In FIG. 19, another device level 1992 having memory cells 1910 has been formed over device level 1891. Forming device level 1992 may include processes similar to or identical to those of the processes described above with reference to FIG. 12 through FIG. 17. In FIG. 19, device level 1992 may be stacked over device level 1891 in the z-dimension similar to the z-dimension of FIG. 10. In memory device 1800 of FIG. 19, each of memory cells 1810 and 1910 may include materials similar to or identical to those of memory cell 310 of FIG. 3. Thus, the access components and memory elements of memory cells 1810 and 1910 may include materials with similar process temperature tolerance. Therefore, damage (e.g., thermal damage) to memory cells 1810, such as thermal damage to memory elements of memory cells 1810, may be avoided when memory cells 1910 on device level 1992 are formed, resulting in formation of memory device 1800 with multiple stacked device levels.

FIG. 20 through FIG. 24 show various processes of forming a memory device 2000 having multiple device levels with shared conduction lines according to an embodiment of the invention. Memory device 2000 (shown in more details in FIG. 24) may correspond to memory device 1100 of FIG. 11. In FIG. 20 through FIG. 24, the cross-section view of the features of memory device 2000 may correspond to a cross-section view of similar features shown in memory device 1100, looking in the y-dimension of FIG. 11. For clarity, FIG. 20 through FIG. 24 include cross-section lines for only some of the features therein.

Figure 20:
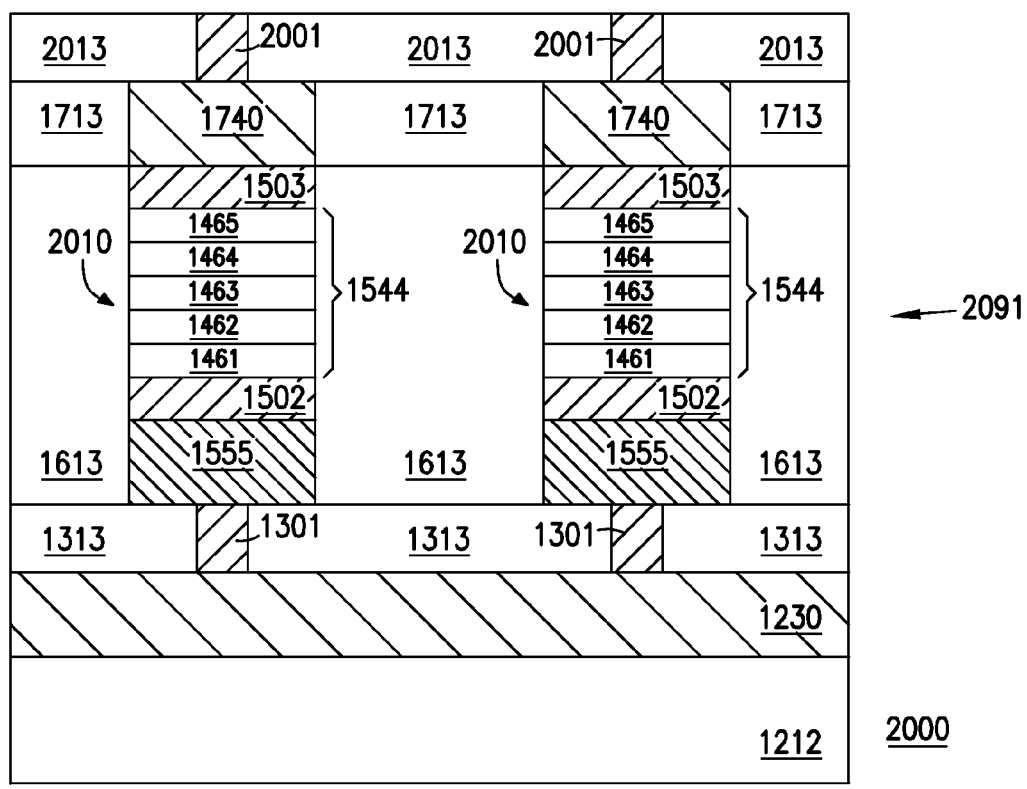
FIG. 20 through FIG. 24 show various processes of forming a memory device having multiple device levels with shared conduction lines according to an embodiment of the invention.

In FIG. 20, device level 2091 having memory cells 2010 has been formed. Forming device level 2091 may include processes similar to or identical to those of the processes described above with reference to FIG. 12 through FIG. 17. Thus, similar or identical features among FIG. 12 through FIG. 17 and FIG. 20 through FIG. 24 have the same reference numbers. In FIG. 20, an insulator 2013 and electrodes 2001 have been formed over device level 2091. Forming insulator 2013 may include depositing an insulation material over device level 2091. Forming electrodes 2001 may include removing some portions of insulator 2013 and depositing material in the removed portion of insulator 2013. The material of electrodes 2013 may be similar to or identical to electrode 301 of FIG. 3.

Figure 21:
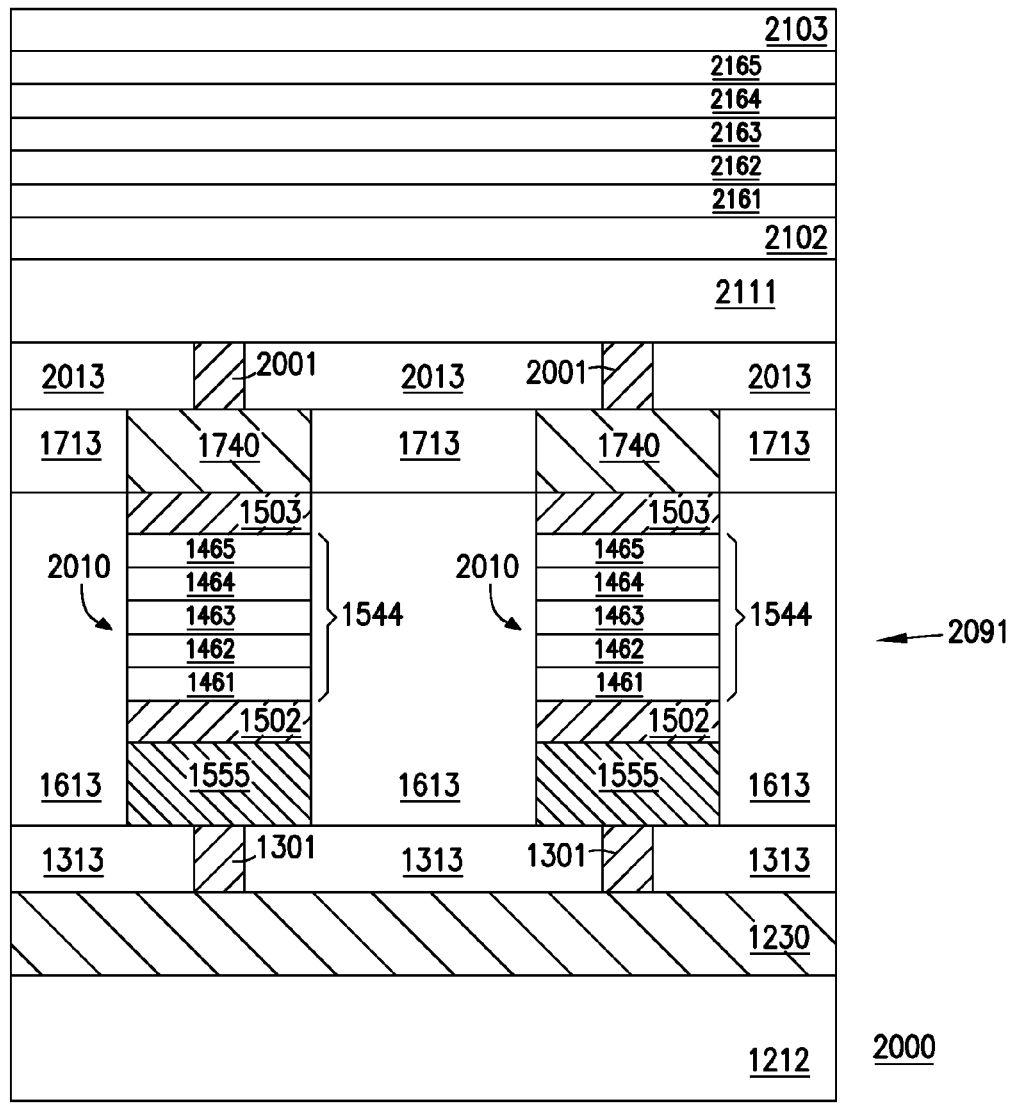

In FIG. 21 multiple layers 2111, 2102, 2161, 2162, 2163, 2164, 2165, and 2103 have been formed. Layer 2111 may include material similar to or identical to those of memory element 333 of FIG. 3; layers 2102 and 2103 may include materials similar to or identical to those of electrodes 302 and 303, respectively, of FIG. 3; and layers 2161, 2162, 2163, 2164, and 2165 may include materials similar to or identical to those of layers 561, 562, 563, 564, and 565, respectively, of access component 555 of FIG. 5.

Figure 22:
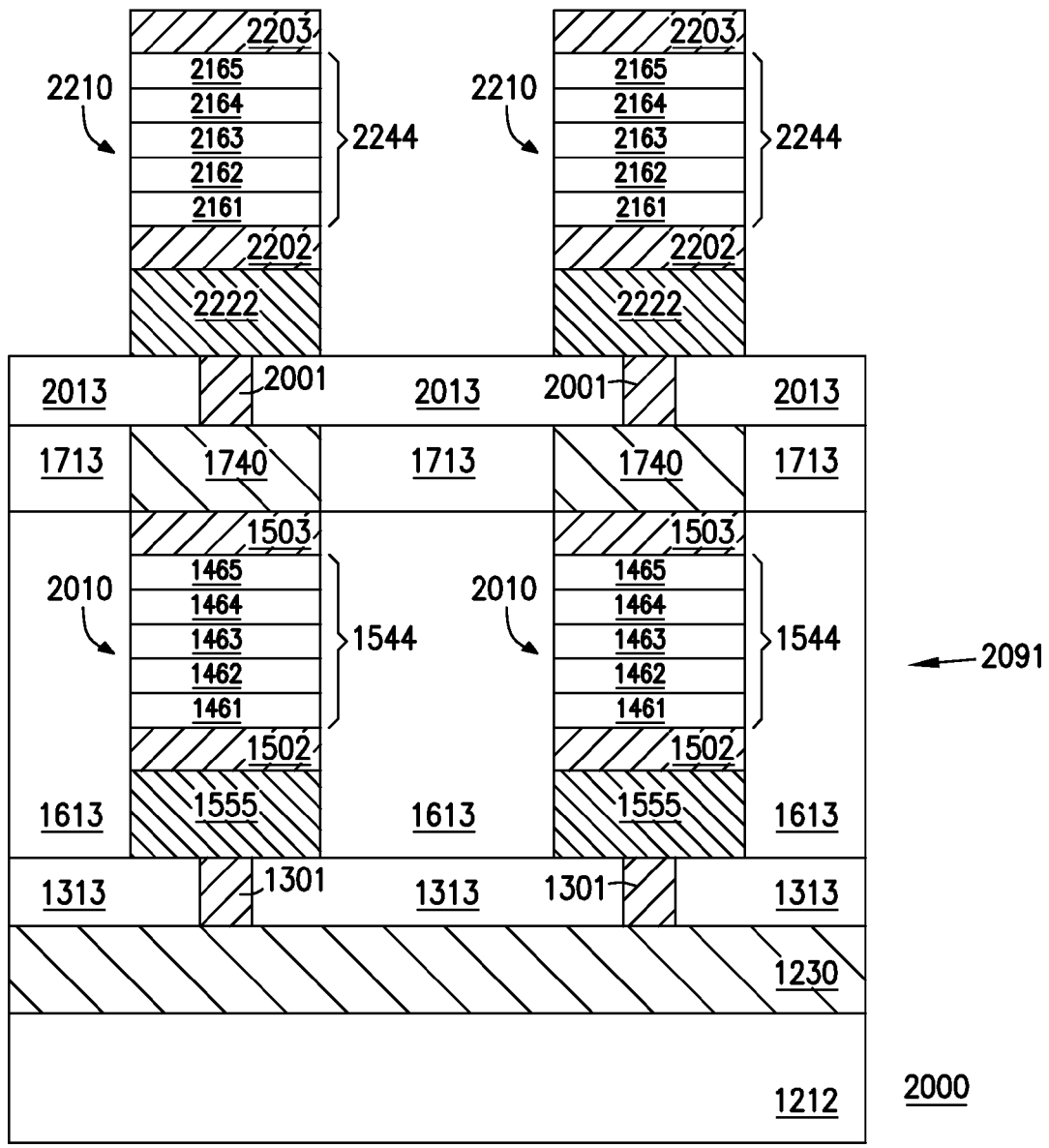

In FIG. 22, memory cells 2210 have been formed. Forming memory cells 2210 may include patterning layers 2111, 2102, 2161, 2162, 2163, 2164, 2165, and 2103 of FIG. 21 into mesas or pillars (as shown FIG. 22) that may form a part of memory cells 2210. Each of memory cells 2210 may include electrodes 2001, 2202, and 2203, memory element 2222, and access component 2244 having multiple layers 2161, 2162, 2163, 2164, and 2165 of FIG. 21 that have been patterned in FIG. 22. FIG. 21 shows five layers 2161, 2162, 2163, 2164, and 2165 as an example. Forming access component 2244 may alternatively include forming fewer or more than five layers so that access component 2244 (FIG. 22) may include material similar to or identical to those of access component 344 of FIG. 3.

Figure 23:
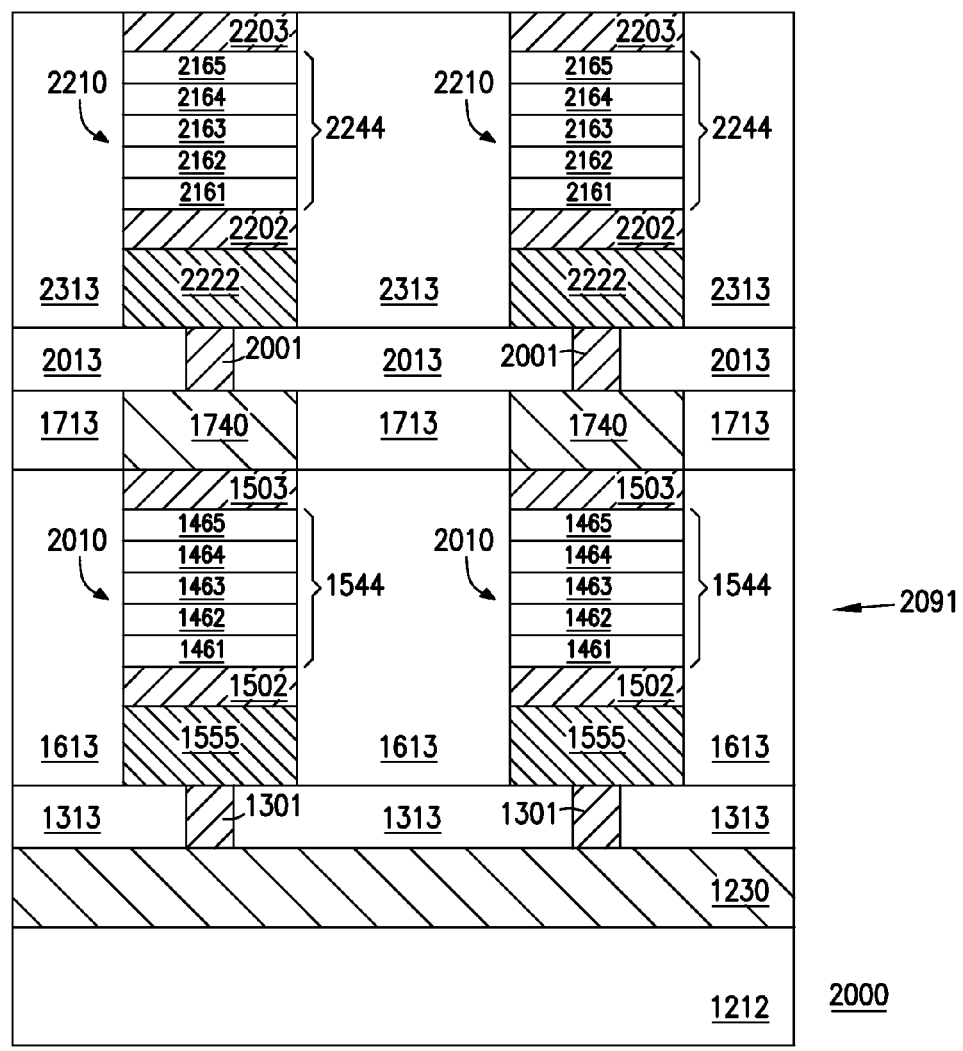

In FIG. 23, an insulator 2313 has been formed. Forming insulator 2313 may include depositing an insulator material over the features of memory cells 1510 of FIG. 15 and then performing a polishing process, such as CMP. The polishing process may stop on electrodes 2203. Alternatively, an additional thin encapsulating layer (e.g., silicon nitride) may be formed before insulator 2313 is formed to protect memory cells 2210.

Figure 24:
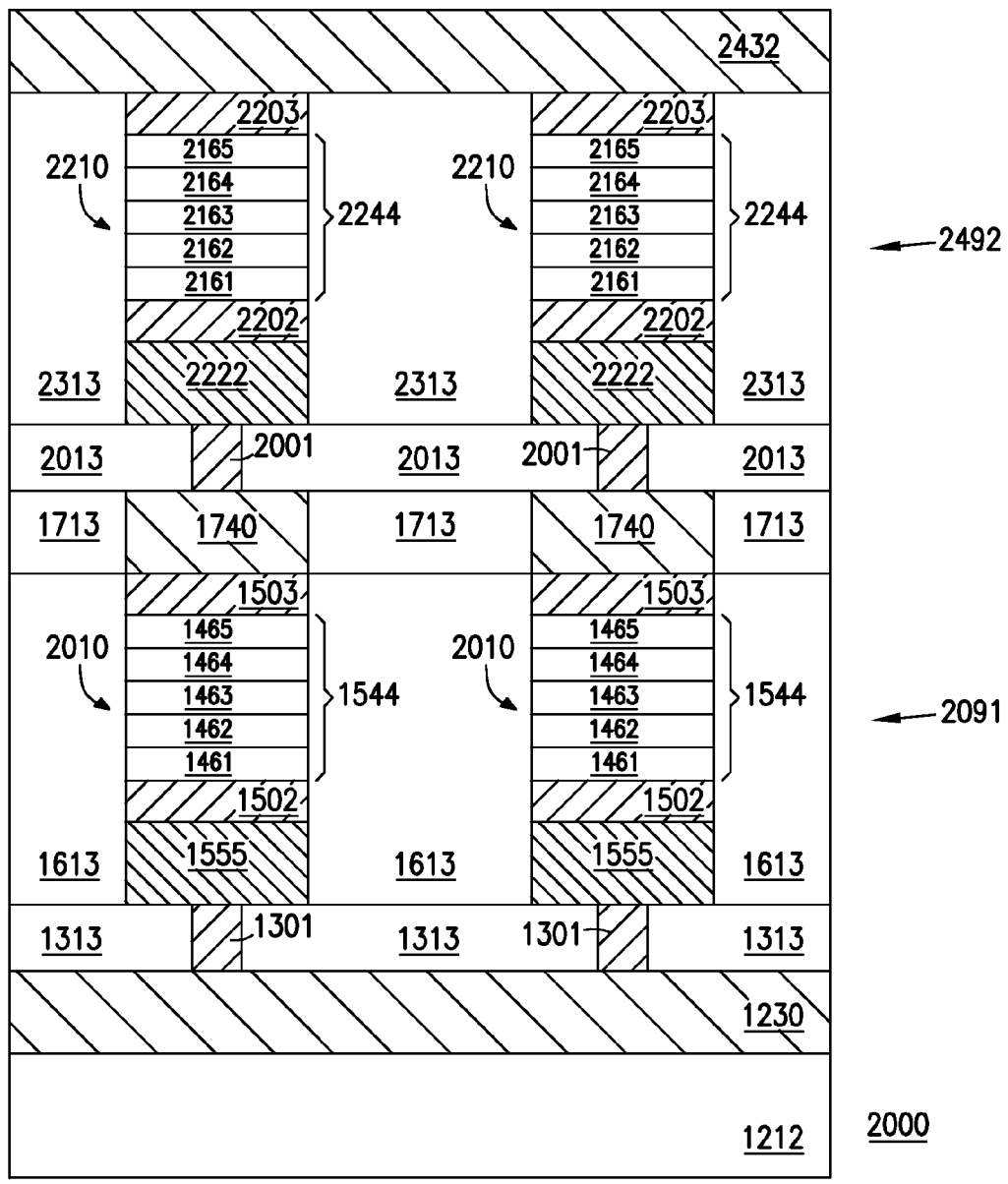

In FIG. 24, conductive line 2432 has been formed. Forming conductive line 2432 may include depositing a conductive material over insulator 2313 and electrodes 2203, and patterning the conductive material to form conductive line 2432 such that conductive line 2432 may be perpendicular (or substantially perpendicular) to conductive lines 1740 and 1741 and parallel (or substantially parallel) to conductive line 1230. Alternatively, forming conductive line 2432 may include a damascene process. The material of conductive line 2432 may be similar to or identical to those of lines 1132 and 1134 of FIG. 11. In FIG. 24, conductive line 2432 may have a greater dimension (e.g., length) extending along the x-dimension similar to the x-dimension of FIG. 11.

As shown in FIG. 24, memory device 2000 may include device level 2091 and device level 2492, which may be stacked over device level 2091 in the z-dimension similar to the z-dimension of FIG. 11. In memory device 2000 of FIG. 24, each of memory cells 2010 and 2210 may include materials similar to or identical to those of memory cell 310 of FIG. 3. Thus, the access components and memory elements of memory cells 2010 and 2210 may include materials with similar process temperature tolerance. Therefore, damage (e.g., thermal damage) to memory cells 2010, such as thermal damage to memory elements of memory cells 2010, may be avoided when memory cells 2210 on device level 2492 are formed, resulting in formation of memory device 2000 with multiple stacked device levels.

One or more embodiments described herein include apparatus and methods having a memory element configured to store information and an access component configured to allow conduction of current through the memory element when a first voltage difference in a first direction across the memory element and the access component exceeds a first voltage value, and to prevent conduction of current through the memory element when a second voltage difference in a second direction across the memory element and the access component exceeds a second voltage value, wherein the access component includes a material excluding silicon. Other embodiments including additional apparatus methods are described above with reference to FIG. 1 through FIG. 24.

The illustrations of apparatus such as memory devices 100, 200, 800, 900, 1000, 1100, 1200, 1800, and 2000, and memory cells 110, 211 though 219, 811 through 819, 821 through 829, 910, 1010, 1110, 1510, 1810, 1910, 2010, and 2210 are intended to provide a general understanding of the structure of various embodiments and not a complete description of all the elements and features of the apparatus that might make use of the structures described herein.

The apparatus of various embodiments may include or be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus comprising:
a first device level including a first memory cell;
a second device level stacked over the first device level, the second device level including a second memory cell, each of the first and second memory cells including a memory element and an access component coupled to the memory element, the access component includes a material, wherein the material excludes silicon;
a first conductive line and a second conductive line coupled to the first memory cell, wherein the first conductive line is substantially perpendicular to the second conductive line; and
a third conductive line and a fourth conductive line coupled to the second memory cell, wherein the third conductive line is substantially perpendicular to the fourth conductive line.

2. The apparatus of claim 1, wherein the material of the access component includes silver-doped germanium sulfide (GeS).

3. The apparatus of claim 1, wherein the material of the memory element includes a phase change material.

4. The apparatus of claim 3, wherein the material of the access component includes silver-doped germanium selenide (GeSe).

5. An apparatus comprising:
a first device level including a first memory cell;
a second device level stacked over the first device level, the second device level including a second memory cell, each of the first and second memory cells including a memory element and an access component coupled to the memory element, the access component includes a material, wherein the material excludes silicon; and
a conductive line between the first and second device levels, wherein the conductive line is shared by the first and second memory cells.

6. The apparatus of claim 5, further comprising a first electrode, a second electrode, a third electrode, and a fourth electrode, wherein the first memory cell is coupled between the first and second electrode, and the second memory cell is coupled between the third and fourth electrodes.

7. The apparatus of claim 6, further comprising a first additional conductive line coupled to the first electrode, and a second additional conductive line coupled to the fourth electrode.

8. The apparatus of claim 7, wherein the conductive line is substantially perpendicular to the first and second additional conductive lines.

9. The apparatus of claim 7, wherein the first memory cell is configured to conduct current between the first and second electrodes when a voltage value of a signal on the conductive line is greater than a voltage value of a signal on the first additional conductive line, and wherein the second memory cell is configured to conduct current between the third and fourth electrodes when a voltage value of a signal on the conductive line is greater than a voltage value of a signal on the second additional conductive.

10. A method comprising:
forming memory material of a memory element; and
forming an access component coupled in series with the memory element, wherein the access component includes a material, wherein the material excludes silicon and includes a bipolar switching material, wherein forming the memory element and the access component includes:
depositing multiple layers of materials that form at least a portion of the memory cell; and
removing a portion of each layer of the multiple layers to form a pillar, wherein the memory element includes a first part of the pillar and the access component includes a second part of the pillar.

11. The method of claim 10, wherein a third part of the pillar forms an electrode of the memory cell, and wherein the third part is between the first and second parts of the pillar.

12. The method of claim 10, wherein the pillar includes a cross-section with a substantially circular shape.

13. The method of claim 10, further comprising forming an electrode of the memory cell, wherein depositing the multiple layers of materials includes:

depositing a unipolar switching memory material contacting the electrode; and depositing a bipolar switching material over the unipolar switching memory material.

14. The method of claim 10, further comprising:

depositing multiple additional layers of materials over the pillar; and removing a portion of each layer of the multiple additional layers to form an additional pillar, wherein the additional pillar includes a first part that forms a memory element of an additional memory cell and a second part that forms an access component of the additional memory cell.

15. The method of claim 14, further comprising:

forming an electrode over the pillar before depositing the multiple additional layers over the pillar, wherein the electrode directly contacts the pillar and directly contacts the additional pillar.

16. The method of claim 10, wherein the bipolar switching material includes one of ion conducting chalcogenide, binary metal oxide, and perovskite oxide.

17. The method of claim 16, wherein the multiple layers of materials include a compound of germanium, antimony, and tellurium.

* * * * *